(12) United States Patent
Cha et al.

(10) Patent No.: US 11,436,974 B1
(45) Date of Patent: Sep. 6, 2022

(54) DISPLAY DEVICE

(71) Applicant: Samsung Display Co., Ltd., Yongin-si (KR)

(72) Inventors: Na Hyeon Cha, Yongin-si (KR); Sun Kwun Son, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/449,864

(22) Filed: Oct. 4, 2021

(30) Foreign Application Priority Data

Mar. 2, 2021 (KR) .................. 10-2021-0027644

(51) Int. Cl.
 *G09G 3/32* (2016.01)
(52) U.S. Cl.
 CPC ....... *G09G 3/32* (2013.01); *G09G 2300/0426* (2013.01); *G09G 2310/0267* (2013.01); *G09G 2310/0275* (2013.01)
(58) Field of Classification Search
 CPC ............. G09G 3/32; G09G 2300/0426; G09G 2310/0267; G09G 2310/0275
 See application file for complete search history.

(56) References Cited

U.S. PATENT DOCUMENTS

| | | | |
|---|---|---|---|
| 2016/0139470 A1* | 5/2016 | Sato | G02F 1/134363 349/123 |
| 2018/0240424 A1* | 8/2018 | Aoki | G09G 3/3406 |
| 2019/0094633 A1* | 3/2019 | Song | H01L 27/3276 |
| 2020/0005703 A1* | 1/2020 | Kim | G09G 3/32 |
| 2020/0258938 A1* | 8/2020 | Chai | H01L 33/62 |

FOREIGN PATENT DOCUMENTS

| | | |
|---|---|---|
| KR | 10-2020938 B1 | 9/2019 |
| KR | 10-2020-0009175 A | 1/2020 |
| KR | 10-2022-0034271 | 3/2022 |

* cited by examiner

*Primary Examiner* — Andrew Sasinowski
(74) *Attorney, Agent, or Firm* — Lewis Roca Rothgerber Christie LLP

(57) ABSTRACT

A display device includes: a pixel, the pixel having a pixel circuit area and an adjacent area extending around at least a portion of the pixel circuit area; first lines at least partially in the adjacent area and extending in a first direction; second lines at least partially in the adjacent area and extending in a second direction perpendicular to the first direction; and alignment electrode layers extending in the second direction and on the first and second lines. A first number of the alignment electrode layers are in the pixel circuit area, and a second number of the alignment electrode layers are in the adjacent area. The first number is greater than the second number.

18 Claims, 12 Drawing Sheets

DISPLAY DEVICE

CROSS-REFERENCE TO RELATED APPLICATION

The application claims priority to and the benefit of Korean Patent Application No. 10-2021-0027644, filed on Mar. 2, 2021, in the Korean Intellectual Property Office, the entire content which is hereby incorporated by reference.

BACKGROUND

1. Field

Aspects of embodiments of the present disclosure relate to a display device.

2. Description of Related Art

In recent years, as interest in information displays has increased, research and development into display devices has been continuously conducted.

SUMMARY

According to embodiments of the present disclosure, a display device has an aperture ratio that is improved by efficiently arranging wires.

According to embodiments of the present disclosure, a display device has improved external visibility by preventing or substantially preventing luminance unevenness from being visually recognized.

Aspects and features of the present disclosure are not limited to those mentioned above, and other aspects and features not mentioned will be clearly understood by those skilled in the art from the following description.

According to an embodiment of the present disclosure, a display device includes, a pixel having a pixel circuit area and an adjacent area extend around at least a portion of the pixel circuit area, first lines at least partially in the adjacent area and extending in a first direction, second lines at least partially in the adjacent area and extending in a second direction perpendicular to the first direction, and alignment electrode layers extending in the second direction and on the first and second lines. A first number of the alignment electrode layers are in the pixel circuit area, a second number of the alignment electrode layers are in the adjacent area, and the first number is greater than the second number.

According to an embodiment, at least a portion of the alignment electrode layers may be in the pixel circuit area without being disposed in the adjacent area.

According to an embodiment, the alignment electrode layers may include a root electrode layer in the adjacent area without being disposed in the pixel circuit area, and the root electrode layer may be spaced apart from at least a portion of the alignment electrode layers in the pixel circuit area.

According to an embodiment, the second lines may include data lines configured to provide a data signal, the data lines may include a first data line, a second data line, and a third data line, and each of the first data line, the second data line, and the third data line may overlap any one of the alignment electrode layers when viewed on a plane.

According to an embodiment, the pixel may include a first sub-pixel configured to emit light of a first color, a second sub-pixel configured to emit light of a second color, and a third sub-pixel configured to emit light of a third color. The alignment electrode layer in the pixel circuit area may include a first cathode electrode layer, a second cathode electrode layer, a third cathode electrode layer, a first anode electrode layer, a second anode electrode layer, a third anode electrode layer, a first floating electrode layer, a second floating electrode layer, and a third floating electrode layer. The first cathode electrode layer, the first anode electrode layer, and the first floating electrode layer may be the alignment electrode layer of the first sub-pixel, the second cathode electrode layer, the second anode electrode layer, and the second floating electrode layer may be the alignment electrode layer of the second sub-pixel, and the third cathode electrode layer, the third anode electrode layer, and the third floating electrode layer may be the alignment electrode layer of the third sub-pixel.

According to an embodiment, the root electrode layer may include a first root electrode layer and a second root electrode layer, the first cathode electrode layer may be spaced apart from the first root electrode layer, and the third floating electrode layer may be spaced apart from the second root electrode layer.

According to an embodiment, the adjacent area may have a first adjacent area, a second adjacent area, and a third adjacent area. The first adjacent area may overlap the pixel circuit area in the first direction, and the second adjacent area and the third adjacent area may overlap the pixel circuit area in the second direction. The sum of widths of the pixel circuit area and the first adjacent area in the first direction may be smaller than a width of the second adjacent area or the third adjacent area in the first direction.

According to an embodiment, the first cathode electrode layer, the first anode electrode layer, and the first floating electrode layer may be sequentially arranged along the first direction, and the third floating electrode layer, the third anode electrode layer, and the third cathode electrode layer may be sequentially arranged along the first direction.

According to an embodiment, the first lines may include a main scan line, the second lines may include a sub-scan line electrically connected to the main scan line at a contact portion, and the sub-scan line may overlap the third cathode electrode layer.

According to an embodiment, the contact portion may overlap the third cathode electrode layer when viewed on a plane.

According to an embodiment, a width of the third cathode electrode layer in the first direction may be greater than a width of each of the third anode electrode layer and the third floating electrode layer in the first direction.

According to an embodiment, the pixel may further include a first light emitting element and a second light emitting element. The first light emitting element may be between the third cathode electrode layer and the third anode electrode layer, and the second light emitting element may be between the third anode electrode layer and the third floating electrode layer.

According to an embodiment, one end of the first light emitting element may be electrically connected to a first contact electrode, another end of the first light emitting element may be electrically connected to a second contact electrode, one end of the second light emitting element may be electrically connected to the second contact electrode, and another end of the second light emitting element may be electrically connected to a third contact electrode.

According to an embodiment, the pixel may further include a light emitting element arranged in a trench area defined by the alignment electrode layer.

According to an embodiment, the second lines may be provided in the second number in the adjacent area, and each of the second lines may overlap the alignment electrode layer.

According to another embodiment of the present disclosure, a display device includes a pixel including a transistor and having a pixel circuit area and an adjacent area extending around at least a portion of the pixel circuit area, first lines in the adjacent area and extending in a first direction, second lines extending in a second direction perpendicular to the first direction, and alignment electrode layers extending in the second direction and on the first and second lines. The first lines include a main scan line configured to provide a scan signal to the transistor, the second lines may include a sub-scan line electrically connected to the main scan line through a contact portion, and the sub-scan line may overlap any one of the alignment electrode layers in the adjacent area.

According to an embodiment, the pixel may include a first light emitting element and a second light emitting element, and the alignment electrode layers may include a cathode electrode layer, an anode electrode layer, and a floating electrode layer. The first light emitting element may be between the cathode electrode layer and the anode electrode layer, the second light emitting element may be between the anode electrode layer and the floating electrode layer, and at least a portion of the cathode electrode layer may overlap the sub-scan line when viewed on a plane.

According to an embodiment, a width of the cathode electrode layer in the first direction may be greater than widths of the anode electrode layer and the floating electrode layer in the first direction, and the floating electrode layer, the anode electrode layer, and the cathode electrode layer may be sequentially arranged in the first direction.

Aspects and features of the present disclosure are not limited to those mentioned above, and aspects and features that are not mentioned may be clearly understood by those skilled in the art from the present specification and the accompanying drawings.

BRIEF DESCRIPTION OF THE DRAWINGS

The accompanying drawings, which are included to provide a further understanding of the present disclosure and are incorporated in and constitute a part of this specification, illustrate some embodiments of the present disclosure, and, together with the description, serve to explain aspects and feature of the present disclosure.

DETAILED DESCRIPTION

Figure 1:
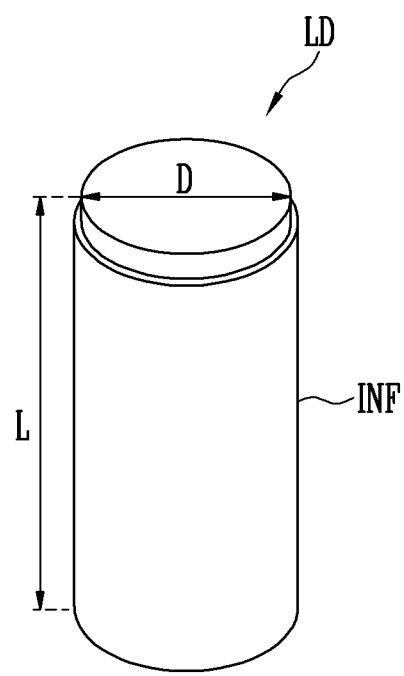
FIG. 1 is a perspective view of a light emitting element according to an embodiment.

The embodiments described in the present specification are intended to clearly explain the spirit of the present disclosure to those skilled in the art to which the present disclosure pertains. Therefore, the present disclosure is not limited by the embodiments described herein. The scope of the present disclosure should be understood as including modifications or variations that do not depart from the spirit of the present disclosure.

Terms used in the present specification have been selected from general terms that are currently widely used in consideration of functions of the present disclosure. However, this may vary according to the intention or custom of a person skilled in the art to which the present disclosure pertains, or the emergence of new technologies. However, when a specific term is defined and used with an arbitrary meaning, the meaning of the term will be separately described. Therefore, the terms used in the present specification should be interpreted based on the actual meanings of the terms and contents throughout the present specification, not the names of the terms.

The drawings attached to the present specification are for easily explaining aspects and features of the present disclosure. Shapes of the components shown in the drawings may be exaggerated and schematically shown or displayed to aid understanding of the present disclosure. Therefore, the present disclosure is not limited by the drawings.

In the present specification, when it is determined that a detailed description of a well-known configuration or function related to the present disclosure may obscure the subject matter of the present disclosure, a detailed description thereof will be omitted as necessary.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The present disclosure relates to a display device. Hereinafter, a display device according to embodiments will be described with reference to FIGS. 1 to 15.

Figure 2:
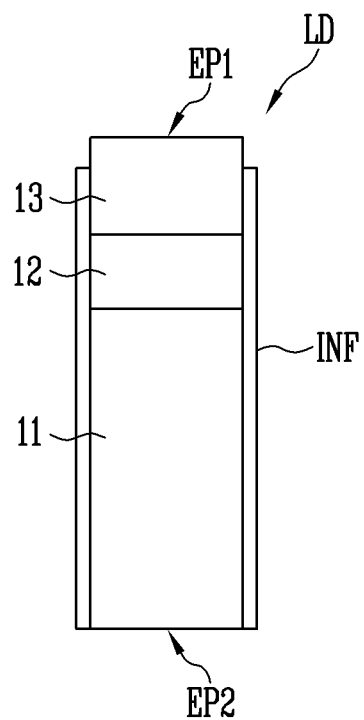
FIG. 2 is a cross-sectional view of the light emitting element shown in FIG. 1.

FIGS. 1 and 2 show a light emitting element LD included in a display device 100 (see, e.g., FIG. 3) according to an embodiment. FIG. 1 is a perspective view illustrating the light emitting element LD according to an embodiment, and FIG. 2 is a cross-sectional view of the light emitting element LD. FIGS. 1 and 2 show the light emitting element LD having a columnar shape, but the type and/or shape of the light emitting element LD is not limited thereto.

Referring to FIGS. 1 and 2, the light emitting element LD may include a first semiconductor layer 11, a second semiconductor layer 13, and an active layer 12 interposed between the first semiconductor layer 11 and the second semiconductor layer 13. For example, when the direction in which the light emitting element LD is extended is referred to as a length L direction, the first semiconductor layer 11, the active layer 12, and the second semiconductor layer 13 may be sequentially stacked along the length L direction.

The light emitting element LD may have a column shape extending along one direction. The light emitting element LD may have a first end EP1 and a second end EP2. The first end EP1 of the light emitting element LD may be adjacent to one of the first semiconductor layer 11 and the second semiconductor layer 13, and the second end EP2 of the light emitting element LD may be adjacent to the other one of the first semiconductor layer 11 and the second semiconductor layer 13.

According to an embodiment, the light emitting element LD may be a light emitting element manufactured to have the column shape through an etching method or the like. In the present specification, the column shape may include a rod-like shape or a bar-like shape that is long in (e.g., is elongated in) the length L direction (e.g., has an aspect ratio that is greater than 1), such as a circular column or a polygonal column, and the cross-sectional shape is not particularly limited. For example, the length L of the light emitting element LD may be larger than a diameter D (or a width) of the cross section.

According to an embodiment, the light emitting element LD may have a size of about nanoscale to microscale. For example, the light emitting element LD may have a diameter D (or width) and/or length L ranging from nanoscale to microscale. However, the size of the light emitting element LD is not limited thereto. The size of the light emitting element LD may be variously changed according to design conditions of a device using a light emitting device including the light emitting element LD as a light source.

The first semiconductor layer 11 may be a first conductivity type semiconductor layer. For example, the first semiconductor layer 11 may include an N-type semiconductor layer. As an example, the first semiconductor layer 11 may include the N-type semiconductor layer including any one semiconductor material from among InAlGaN, GaN, AlGaN, InGaN, AlN, and InN and doped with a first conductivity type dopant, such as Si, Ge, Sn, and the like. However, the material of (or constituting) the first semiconductor layer 11 is not limited thereto, and the first semiconductor layer 11 may be formed of various other materials.

The active layer 12 may be disposed on the first semiconductor layer 11 and may be formed in a single-quantum well or multi-quantum well structure. The position of the active layer 12 may be variously changed according to the type of the light emitting element LD.

A cladding layer doped with a conductive dopant may be formed on and/or under the active layer 12. For example, the cladding layer may include (or may be formed of) an AlGaN layer or an InAlGaN layer. According to an embodiment, materials such as AlGaN and InAlGaN may be used to form the active layer 12, and various other materials may form (or constitute) the active layer 12.

The second semiconductor layer 13 may be disposed on the active layer 12 and may include a semiconductor layer of a different type from the first semiconductor layer 11. For example, the second semiconductor layer 13 may include a P-type semiconductor layer. For example, the second semiconductor layer 13 may include the P-type semiconductor layer including at least one semiconductor material from among InAlGaN, GaN, AlGaN, InGaN, AlN, and InN and doped with a second conductivity type dopant, such as Mg and the like. However, the material of (or constituting) the second semiconductor layer 13 is not limited thereto, and the second semiconductor layer 13 may be formed of various other materials.

When a voltage higher than a threshold voltage is applied to both ends (e.g., opposite ends) of the light emitting element LD, light may be emitted from the light emitting element LD while electron-hole pairs are coupled in the active layer 12. By controlling the emission of the light emitting element LD using this principle, the light emitting element LD may be used as a light source of various light emitting devices, including pixels of a display device.

According to an embodiment, the light emitting element LD may further include an insulating film INF provided on a surface of the light emitting element LD. The insulating film INF may be formed on the surface of the light emitting element LD to surround at least the outer circumferential surface of the active layer 12. In addition, the insulating film INF may further surround an area of each of the first and second semiconductor layers 11 and 13. The insulating film INF may be formed of a single film or a double film, but the present disclosure is not limited thereto. The insulating film INF may be formed of a plurality of films (e.g., three of more films). For example, the insulating film INF may include a first insulating film including a first material and a second insulating film including a second material different from the first material.

According to an embodiment, the insulating film INF may expose both ends EP1/EP2 of the light emitting element LD, which have different polarities. For example, the insulating film INF may expose one end of each of the first and second semiconductor layers 11 and 13 positioned at the first and second ends EP1 and EP2 of the light emitting element LD. In another embodiment, the insulating film INF may expose side portions of the first and second semiconductor layers 11 and 13 adjacent to the first and second ends EP1 and EP2 of the light emitting element LD.

According to an embodiment, the insulating film INF may include at least one insulating material from among silicon oxide (SiOx), silicon nitride (SiNx), silicon oxynitride (SiOxNy), aluminum oxide (AlOx), and titanium oxide (TiOx) and may be composed of a single layer or may include a plurality of layers. However, the present disclosure is not limited thereto. For example, according to another embodiment, the insulating film INF may be omitted.

According to an embodiment, when the insulating film INF is provided to cover the surface of the light emitting element LD, particularly the outer circumferential surface of the active layer 12, electrical stability of the light emitting element LD can be ensured. In addition, when the insulating film INF is provided on the surface of the light emitting element LD, the lifespan and efficiency can be improved by reducing or minimizing surface defects of the light emitting element LD. In addition, even when a plurality of light emitting elements LD are disposed adjacent to each other, an unwanted short circuit that may occur between the light emitting elements LD can be prevented or substantially prevented.

According to an embodiment, the light emitting element LD may further include an additional component in addition to the first semiconductor layer 11, the active layer 12, the second semiconductor layer 13, and/or the insulating film INF surrounding them. For example, the light emitting element LD may further include at least one phosphor layer, active layer, semiconductor layer, and/or electrode layer disposed on one end side of the first semiconductor layer 11, the active layer 12, and/or the second semiconductor layer 13. For example, contact electrode layers may be further disposed at the first and second ends EP1 and EP2 of the light emitting element LD, respectively.

Figure 3:
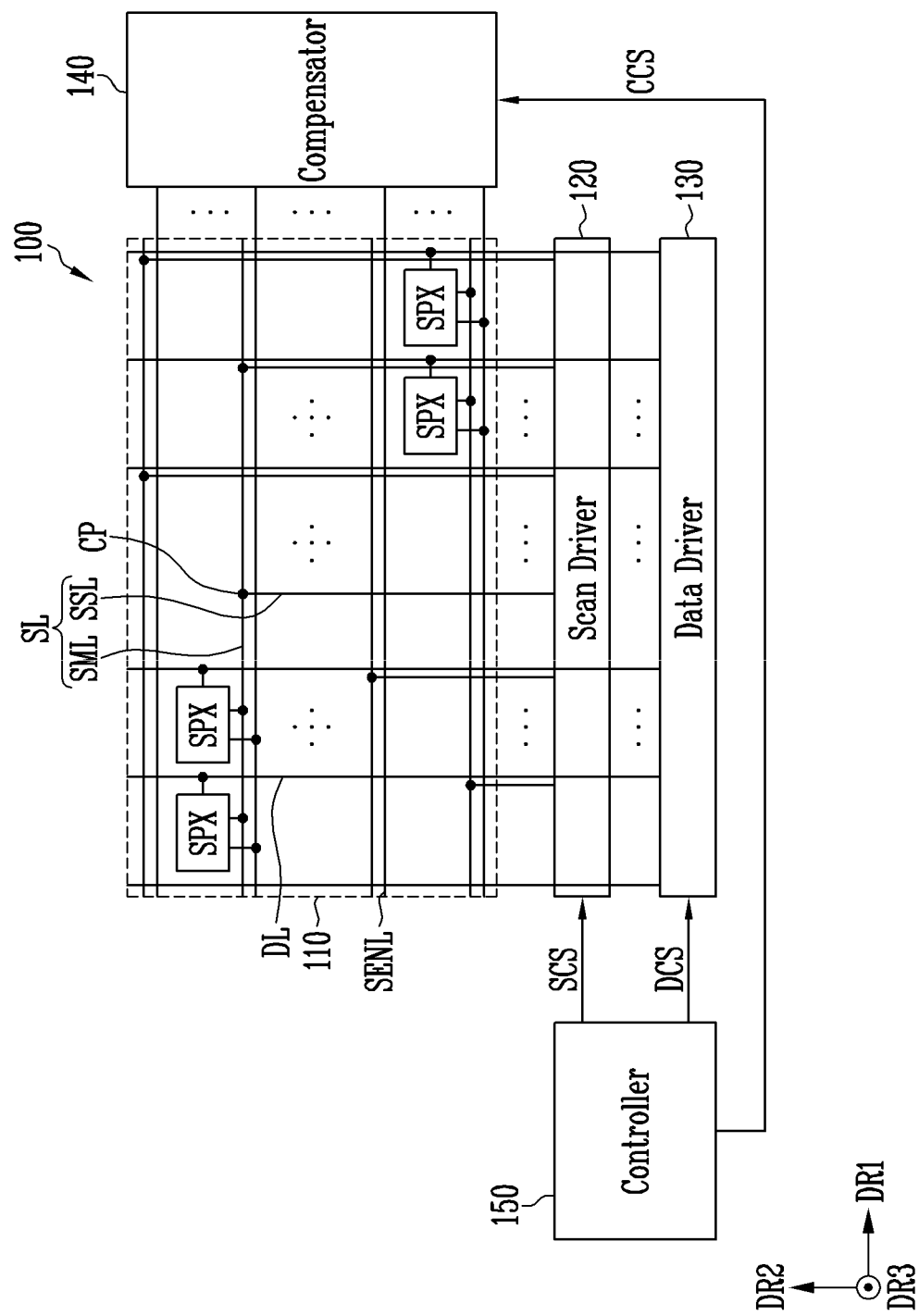
FIG. 3 is a block diagram illustrating a display device according to an embodiment.

FIG. 3 is a block diagram illustrating a display device according to an embodiment.

The display device 100 may refer to a device configured to provide visual data to a user. The display device 100 may be an electronic device using the light emitting element LD described above with reference to FIGS. 1 and 2 as a light source. According to an embodiment, the display device 100 may be a tablet PC, a television, a smart phone, a laptop, or the like, but it is not limited to a specific example.

According to an embodiment, the display device 100 may include a pixel part (e.g., a pixel area) 110, a scan driver 120, a data driver 130, a compensator 140, and a controller 150.

The pixel part 110 may include a plurality of sub-pixels SPX connected to scan lines SL and data lines DL. According to an embodiment, at least one of the sub-pixels SPX may constitute a pixel (see, e.g., "PX" in FIG. 4). For example, the sub-pixels SPX may include first to third sub-pixels (see, e.g., "SPX1 to SPX3" in FIG. 4) constituting one pixel PX.

The scan driver 120 may be disposed on one side of the pixel part 110. The scan driver 120 may receive a first control signal SCS from the controller 150. The scan driver 120 may supply a scan signal to the scan lines SL in response to the first control signal SCS.

According to an embodiment, the first control signal SCS may be a signal for controlling a driving timing of the scan driver 120. The first control signal SCS may include a scan start signal for the scan signal and a plurality of clock signals. The scan signal may be set to a gate-on level corresponding to the type of transistor to which a corresponding scan signal is supplied.

The data driver 130 may be disposed on one side of the pixel part 110. The data driver 130 may receive a second control signal DCS from the controller 150. The data driver 130 may supply a data signal to the data lines DL in response to the second control signal DCS.

According to an embodiment, the second control signal DCS may be a signal for controlling a driving timing of the data driver 130.

The compensator 140 may receive a sensing value (e.g., current or voltage information) extracted from a sub-pixel SPX through a sensing line SENL. The compensator 140 may generate a compensation value for compensating the deterioration of the sub-pixel SPX based on the sensing value. For example, the compensator 140 may obtain information based on a change in characteristics of a first transistor (see, e.g., "T1" in FIG. 5) and/or the light emitting element LD (e.g., changes in threshold voltage, mobility, and other characteristics of the first transistor T1). The compensator 140 may calculate a compensation value for compensating the data signal based on the information regarding (or based on) the change in characteristics and may provide the compensation value to the controller 150 or to the data driver 130.

According to an embodiment, the compensator 140 may receive a third control signal CCS from the controller 150. The compensator 140 may supply a sensing signal to the sub-pixel SPX in response to the third control signal CCS.

According to an embodiment, the third control signal CCS may be a signal for controlling driving of the compensator 140 for compensating the sensing and deterioration of the sub-pixels SPX.

The controller 150 may obtain (or generate) the first control signal SCS, the second control signal DCS, and the third control signal CCS. The controller 150 may generate the first control signal SCS and the second control signal DCS and provide them to the scan driver 120 and the data driver 130, respectively. The controller 150 may generate the third control signal CCS and provide it to the compensator 140.

According to an embodiment, a single side driving structure in which the scan driver 120 and the data driver 130 are disposed on one side of the pixel part 110 may be provided.

Hereinafter, for convenience of description, the display device 100 including the single side driving structure will be described as an example.

According to an embodiment, in order to apply the single side driving structure to the display device 100, a scan line SL may include a main scan line SML and a sub-scan line SSL.

The main scan line SML may be connected to at least one sub-scan line SSL. For example, as shown in FIG. 3, two sub-scan lines SSL may be electrically connected to one main scan line SML.

The main scan line SML may extend in a first direction DR1 and may be connected to the sub-pixel SPX of a pixel row corresponding thereto. The main scan line SML may supply the scan signal to the sub-pixel SPX.

The sub-scan line SSL may extend in a second direction DR2 and may be connected to the main scan line SML at a contact portion CP. The sub-scan line SSL may electrically connect the scan driver 120 and the main scan line SML.

A direction of the pixel row may be a horizontal direction and may be the first direction DR1 in the drawings. A direction of a pixel column may be a vertical direction and may be the second direction DR2 in the drawings. The pixel row and the pixel column may be defined by an arrangement of the sub-pixels SPX. The pixel row may be defined by the main scan line SML.

When the sub-scan line SSL is electrically connected to the main scan line SML, a deviation of RC load (RC delay) at a portion adjacent to each contact point and a portion spaced apart from each contact point may increase. To reduce the deviation of the RC load, the main scan line SML may be connected to a plurality of sub-scan lines SSL. For example, because the scan signal is supplied to the main scan line SML through a plurality of contact portions CP, the deviation of the RC load for each position within the main scan line SML may be relatively reduced.

A data line DL may extend along the pixel column (e.g., the second direction DR2) and may be connected to the sub-pixel SPX. The data line DL may supply the data signal to the sub-pixel SPX connected thereto.

In FIG. 3, the scan driver 120, the data driver 130, the compensator 140, and the controller 150 are shown separately (e.g., as shown as separate components), but at least some of the scan driver 120, the data driver 130, the compensator 140, and the controller 150 may be integrated into one module or integrated circuit chip (IC). For example, at least some components and/or functions of the controller 150 may be included in (or integrated into) the data driver 130.

According to an embodiment, the scan driver 120 may include a plurality of scan drivers (e.g., a plurality of scan driving chips or scan driving circuits) that respectively drive partial areas of the pixel part 110. The data driver 130 may include a plurality of data drivers (e.g., a plurality of data driving chips or data driving circuits) that respectively drive the partial areas of the pixel part 110.

Figure 4:
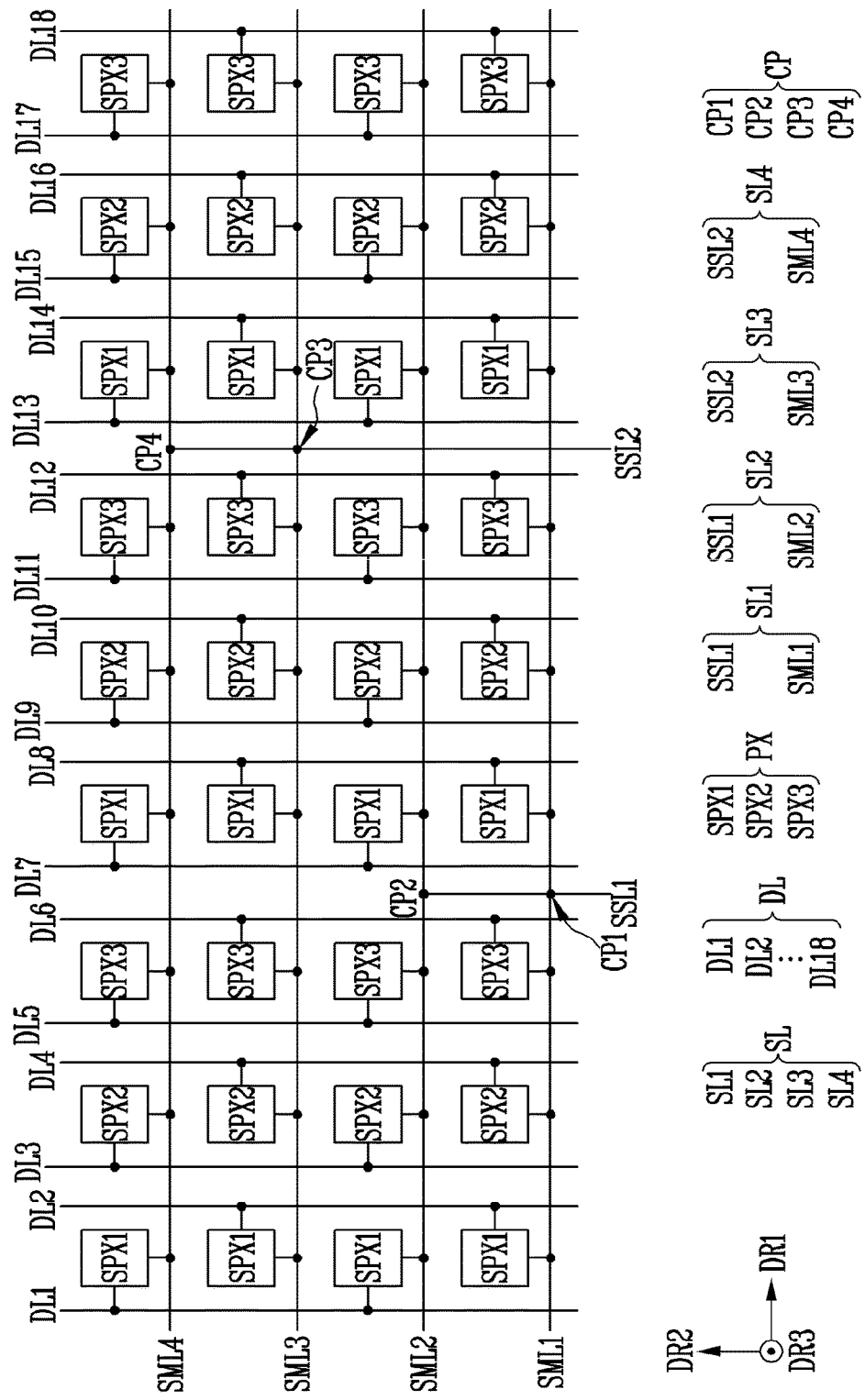
FIG. 4 is a diagram schematically illustrating a pixel part included in the display device according to an embodiment.

FIG. 4 is a diagram schematically illustrating a pixel part included in the display device according to an embodiment.

Referring to FIG. 4, a pixel PX may include a first sub-pixel SPX1, a second sub-pixel SPX2, and a third sub-pixel SPX3.

In FIG. 4, for convenience of description, the description will be made based on first to eighteenth data lines DL1 to DL18 of the data line DL and first to fourth scan lines SL1 to SL4 of the scan line SL, which are described above with reference to FIG. 3.

According to an embodiment, the sub-pixels SPX1, SPX2, and SPX3 may be connected to any one of the data lines DL1 to DL18 and any one of the scan lines SL1 to SL4, respectively.

According to an embodiment, the first sub-pixel SPX1, the second sub-pixel SPX2, and the third sub-pixel SPX3 may emit light of different colors. The first sub-pixel SPX1, the second sub-pixel SPX2, and the third sub-pixel SPX3 may constitute one pixel PX. For example, the first sub-pixel SPX1 may emit red light, the second sub-pixel SPX2 may emit green light, and the third sub-pixel SPX3 may emit blue light.

According to an embodiment, because the scan driver 120 and the data driver 130 are disposed on the same side in the single side driving structure, the data lines DL1 to DL18 and sub-scan lines SSL1 and SSL2 may extend in the same direction (for example, the second direction DR2).

According to an embodiment, a first sub-scan line SSL1 may be connected to a first main scan line SML1 and a second main scan line SML2. For example, the first sub-scan line SSL1 may be connected to the first main scan line SML1 through a first contact portion CP1 and to the second main scan line SML2 through a second contact portion CP2. The first main scan line SML1 and the first sub-scan line SSL1 may form a first scan line SL1 corresponding to a first pixel row, and the first sub-scan line SSL1 and the second main scan line SML2 may form a second scan line SL2 corresponding to a second pixel row. Accordingly, the scan signal may be simultaneously (or concurrently) supplied to the first scan line SL1 and the second scan line SL2.

According to an embodiment, one sub-scan line SSL may be connected to a plurality of main scan lines SML so that the scan signal is simultaneously (or concurrently) supplied to a plurality of pixel rows.

According to an embodiment, the data lines DL1 to DL18 may not be connected to the sub-pixels SPX of adjacent pixel rows. For example, a first data line DL1 may be connected to first sub-pixels SPX1 of even-numbered pixel rows of a first pixel column, and a second data line DL2 may be connected to first sub-pixels SPX1 of odd-numbered pixel rows of the first pixel column. A third data line DL3 may be connected to second sub-pixels SPX2 of even-numbered pixel rows of a second pixel column, and a fourth data line DL4 may be connected to second sub-pixels SPX2 of odd-numbered pixel rows of the second pixel column. A fifth data line DL5 may be connected to third sub-pixels SPX3 of even-numbered pixel rows of a third pixel column, and a sixth data line DL6 may be connected to third sub-pixels SPX3 of odd-numbered pixel rows of the third pixel column.

According to an embodiment, one pixel PX may be positioned between the first sub-scan line SSL1 and the second sub-scan line SSL2. The contact portions CP and the sub-scan lines SSL may be disposed at intervals (e.g., at regular or predetermined intervals).

As described above, in the single side driving structure of the display device 100, the scan lines SL may be respectively connected to the contact portions CP in the pixel part 110.

In some instances, contact portions CP1 to CP4 may interfere with wirings adjacent to the sub-pixels SPX1, SPX2, and SPX3. Accordingly, a problem of visually recognizing luminance unevenness may occur along a trench area in which the contact portions CP1 to CP4 are arranged. However, according to an embodiment, because the contact portions CP1 to CP4 and the sub-scan lines SSL may be shielded by an electrode configuration (e.g., a predetermined electrode configuration), the luminance unevenness may not be visually recognized. A detailed description of this will be described later with reference to FIG. 13.

Figure 5:
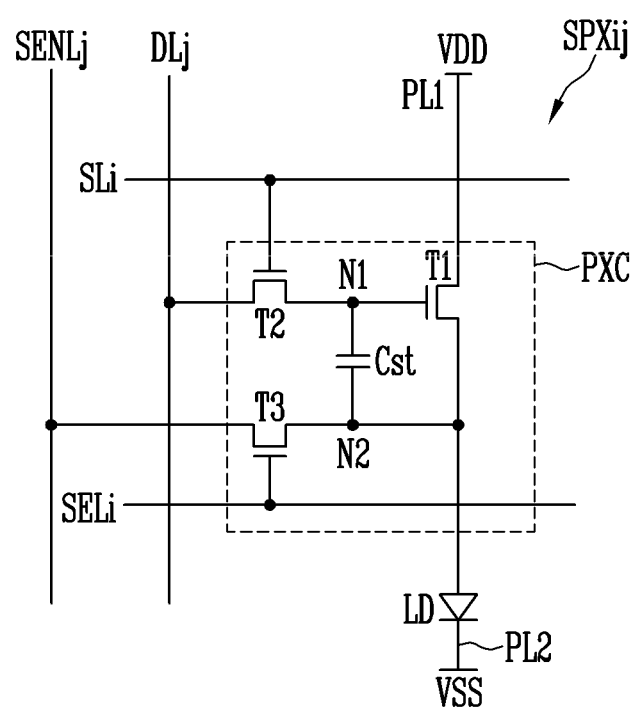
FIG. 5 is a circuit diagram schematically illustrating a pixel circuit included in a pixel according to an embodiment.

FIG. 5 is a circuit diagram illustrating a pixel circuit included in a pixel according to an embodiment.

A sub-pixel SPXij shown in FIG. 5 may be any one of the sub-pixels SPX described above with reference to FIGS. 3 and 4 and may refer to a sub-pixel SPX connected to an i-th scan line SLi, a j-th data line DLj, an i-th sensing signal line SELi, and a j-th sensing line SENLj, where i and j may be natural numbers.

Referring to FIG. 5, the sub-pixel SPXij may include a light emitting element LD and a pixel circuit PXC.

The light emitting element LD may be connected between a first power source VDD and a second power source VSS. One end of the light emitting element LD (e.g., a P-type semiconductor) may be connected to the first power source VDD via the pixel circuit PXC and a first power source line PL1, and the other end of the light emitting element LD (e.g., an N-type semiconductor) may be connected to the second power source VSS via a second power source line PL2.

According to an embodiment, when a driving current is supplied through the pixel circuit PXC, the light emitting element LD may emit light having a luminance corresponding to the driving current.

According to an embodiment, light emitting elements LD may be connected to each other through various connection structures between the first power source VDD and the second power source VSS. For example, the light emitting elements LD may be connected to each other only in parallel or may be connected to each other only in series. In other embodiments, the light emitting elements LD may be connected in a series/parallel mixed structure.

The first power source VDD and the second power source VSS may have different potentials so that the light emitting elements LD emit light. For example, the first power source VDD may be set to a higher potential than the second power source VSS.

According to an embodiment, the first power source VDD and the second power source VSS may have a potential difference such that light can be emitted during an emission period of the sub-pixel SPXij.

The pixel circuit PXC may be connected between the first power source VDD and the light emitting element LD. The pixel circuit PXC may include a first transistor T1, a second transistor T2, a third transistor T3, and a storage capacitor Cst.

One electrode of the first transistor T1 may be connected to the first power source VDD, and the other electrode may be connected to one electrode (e.g., an anode electrode) of the light emitting element LD. A gate electrode of the first transistor T1 may be connected to a first node N1. The first transistor T1 may control a current flowing through the light emitting element LD in response to a voltage applied through the first node N1.

One electrode of the second transistor T2 may be connected to the j-th data line DLj, and the other electrode may be connected to the first node N1. A gate electrode of the second transistor T2 may be connected to the i-th scan line SLi. The second transistor T2 may be turned on when a scan signal is supplied from the i-th scan line SLi. In this case, the data signal provided from the j-th data line DLj may be transferred to the first node N1.

One electrode of the third transistor T3 may be connected to the j-th sensing line SENLj, and the other electrode may be connected to a second node N2. A gate electrode of the third transistor T3 may be connected to the i-th sensing signal line SELi. When the third transistor T3 is turned on in response to a sensing signal provided from the i-th sensing signal line SELi, a reference voltage may be provided to the second node N2 through the j-th sensing line SENLj.

According to an embodiment, the reference voltage may serve to set or initialize a voltage of the electrode of the first transistor T1 (e.g., a source electrode of the first transistor T1) connected to the light emitting element LD to a constant value. According to an example, the reference voltage may be set to be less than or equal to a voltage of the second power source VSS.

According to an embodiment, when the third transistor T3 is turned on in response to the sensing signal provided from the i-th sensing signal line SELi, a sensing current may be transferred to the j-th sensing line SENLj.

According to an embodiment, the sensing current may be provided to the compensator 140. The sensing current may be used to calculate the amount of change in mobility and threshold voltage of the first transistor T1.

The storage capacitor Cst may be connected between the first node N1 (or the gate electrode of the first transistor T1) and the second node N2 (or the other electrode of the first transistor T1). The storage capacitor Cst may store information on a difference between a voltage of the first node N1 and a voltage of the second node N2.

The structure of the pixel circuit PXC is not limited to the structure shown in FIG. 5, and the pixel circuit PXC may be implemented in various types of suitable structures.

In addition, in the present embodiment, the first to third transistors T1 to T3 are shown as N-type transistors, but the present disclosure is not limited thereto. According to an embodiment, the first to third transistors T1 to T3 may be P-type transistors.

Figure 6:
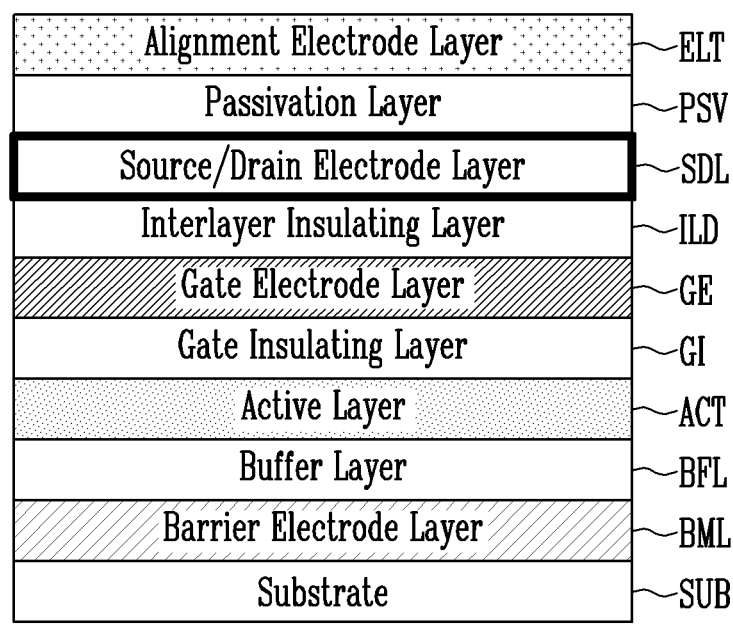
FIG. 6 is a diagram schematically showing a stacked structure included in a display device according to an embodiment.

FIG. 6 is a diagram schematically illustrating a stacked structure included in the display device according to an embodiment.

Referring to FIG. 6, a stacked structure included in the display device according to the embodiment may have a structure in which a substrate SUB, a barrier electrode layer BML, a buffer layer BFL, an active layer ACT, a gate insulating layer GI, a gate electrode layer GE, an interlayer insulating layer ILD, a source/drain electrode layer SDL, a passivation layer PSV, and an alignment electrode layer ELT are sequentially stacked and at least a portion of the structure is patterned.

The substrate SUB may constitute a base member of the display device 100 and may be a rigid or flexible substrate or film.

The buffer layer BFL may be a layer for preventing (or substantially preventing) diffusion of impurities or penetration of moisture into the active layer ACT including a semiconductor. According to an embodiment, the buffer layer BFL may include at least one of metal oxides such as silicon nitride (SiNx), silicon oxide (SiOx), silicon oxynitride (SiOxNy), and aluminum oxide (AlOx).

The active layer ACT may be a layer including a semiconductor. For example, the active layer ACT may include at least one of polysilicon, amorphous silicon, and oxide semiconductor. According to an embodiment, the active layer ACT may be a channel of each of the transistors T1 to T3, and a portion thereof contacting the source/drain electrode layer SDL may be doped with impurities.

The barrier electrode layer BML, the gate electrode layer GE, the source/drain electrode layer SDL, and the alignment electrode layer ELT may be layers including a conductive material. Each of the barrier electrode layer BML, the gate electrode layer GE, and the source/drain electrode layer SDL may be formed of a single layer or a plurality of layers. According to an embodiment, each of the barrier electrode layer BML, the gate electrode layer GE, and the source/drain electrode layer SDL may include any one of gold (Au), silver (Ag), aluminum (Al), molybdenum (Mo), chromium (Cr), titanium (Ti), nickel (Ni), neodymium (Nd), copper (Cu), and platinum (Pt).

The gate insulating layer GI, the interlayer insulating layer ILD, and the passivation layer PSV may be interposed between the layers to electrically separate the active layer ACT, the gate electrode layer GE, the source/drain electrode layer SDL, and the alignment electrode layer ELT from each other. According to an embodiment, electrode patterns (e.g., necessary electrode patterns) may be electrically connected to each other through contact holes formed in the gate insulating layer GI, the interlayer insulating layer ILD, and the passivation layer PSV.

According to an embodiment, the gate insulating layer GI, the interlayer insulating layer ILD, and the passivation layer PSV may include at least one of silicon nitride (SiNx), silicon oxide (SiOx), silicon oxynitride (SiOxNy), and aluminum oxide (AlOx). According to an embodiment, the gate insulating layer GI, the interlayer insulating layer ILD, and the passivation layer PSV may include an organic material, and may be composed of a single layer or a plurality of layers.

Hereinafter, a configuration of electrodes of the first sub-pixel SPX1, the second sub-pixel SPX2, and the third sub-pixel SPX3 will be described with reference to FIGS. 7 to 9. Contents overlapping with those described above will be omitted or only briefly described.

Figure 7:
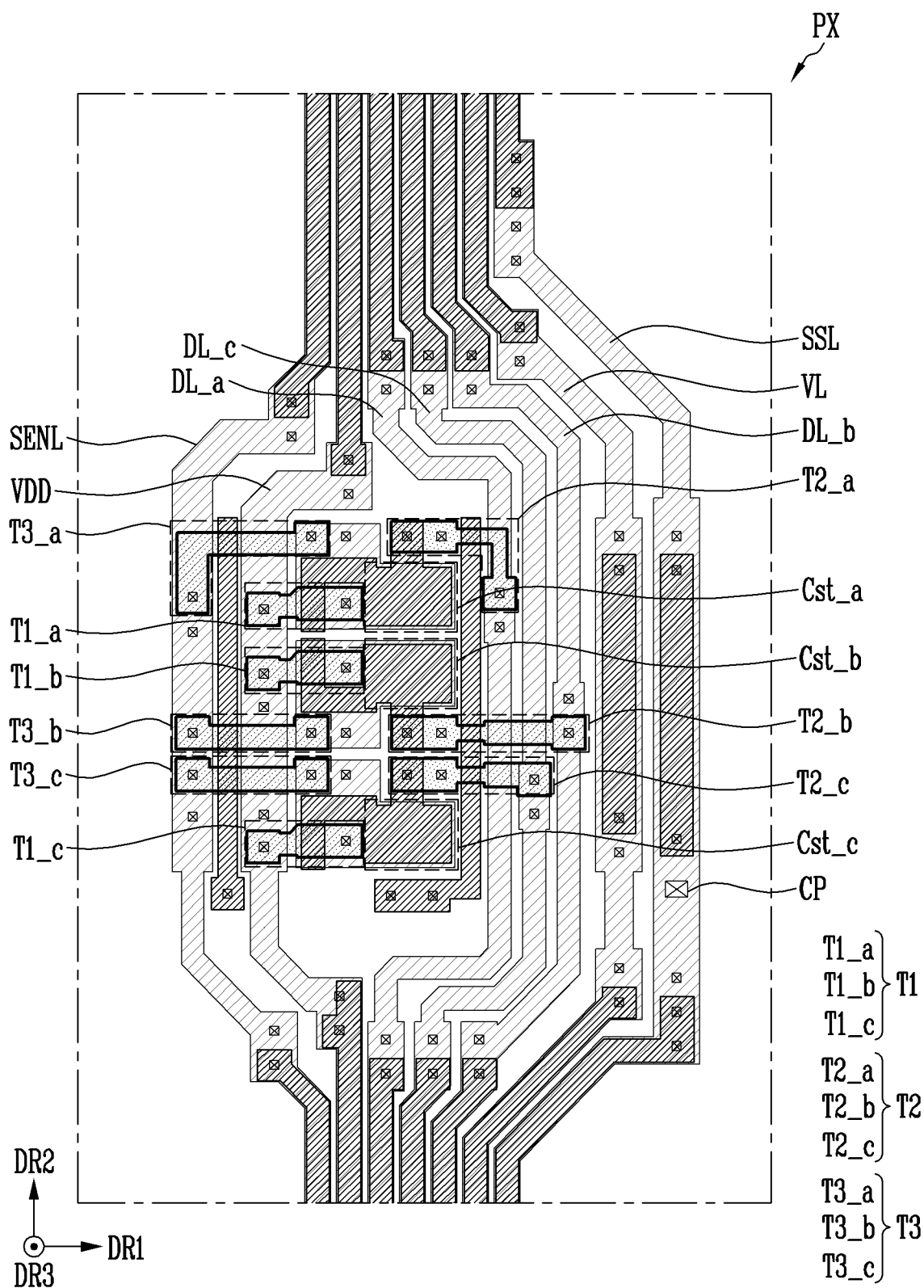
FIGS. 7 to 9 are layout diagrams illustrating a configuration of electrodes of a pixel according to an embodiment.
Figure 8:
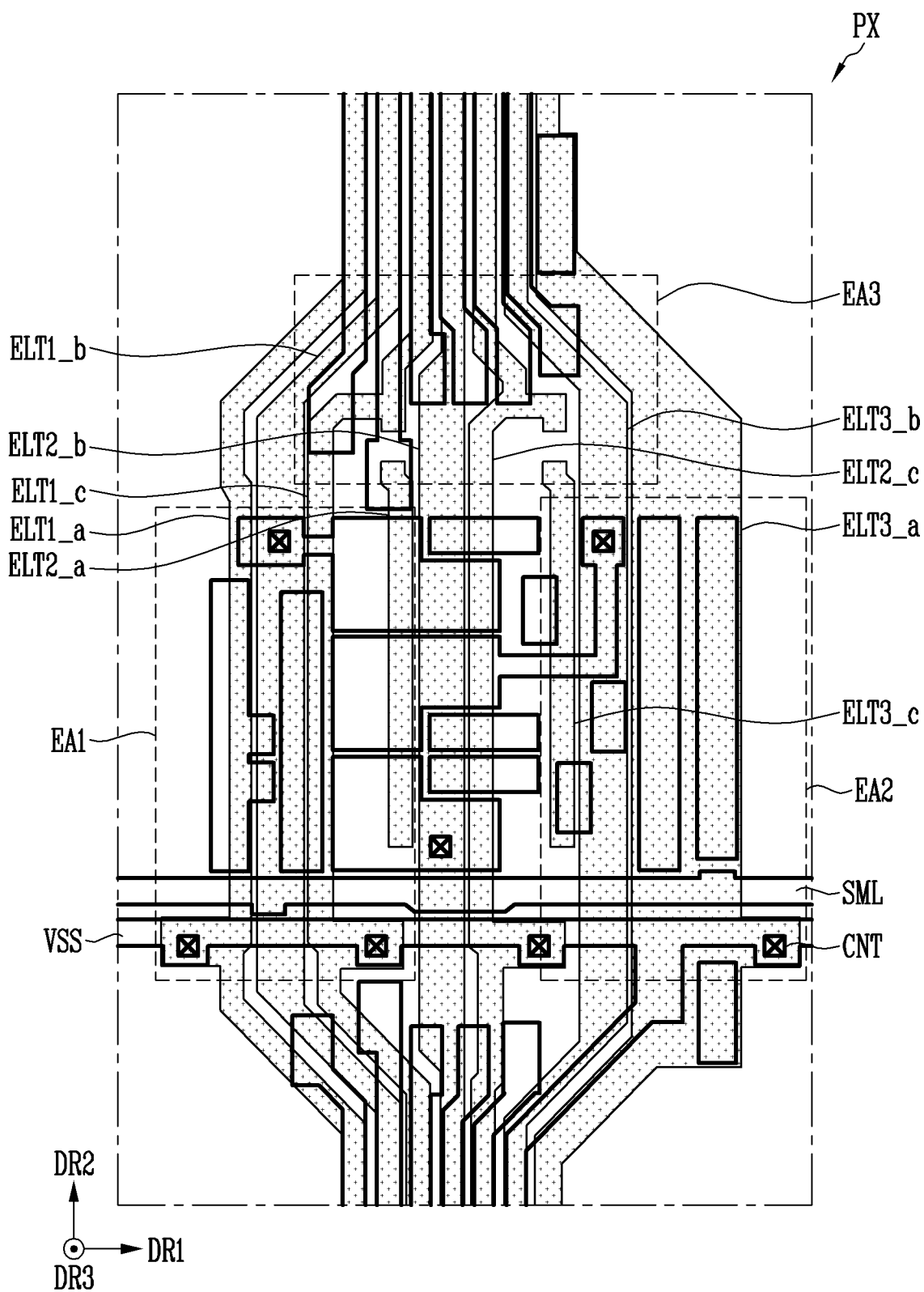
Figure 9:
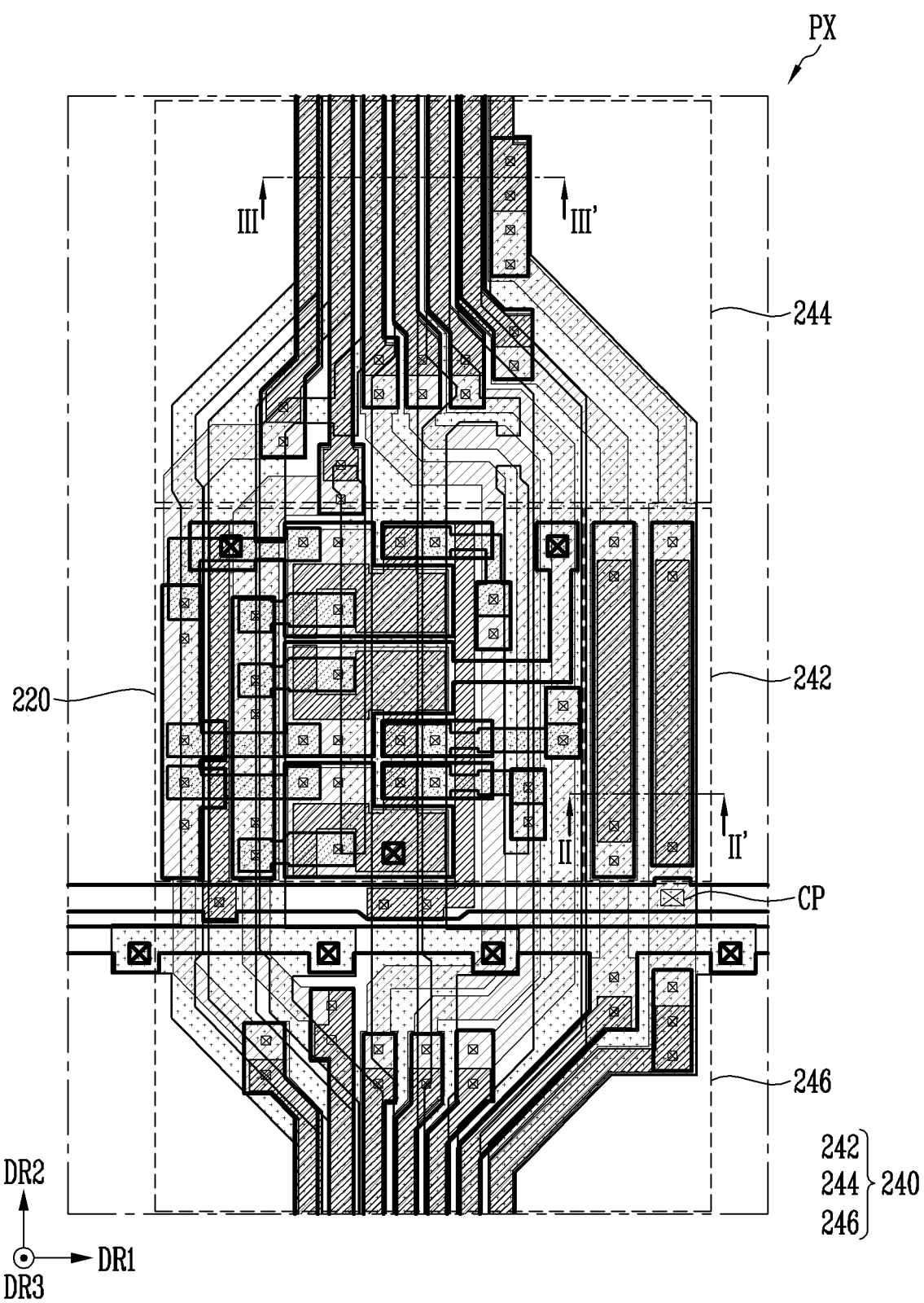

FIGS. 7 to 9 are layout diagrams illustrating a configuration of electrodes constituting the pixel according to an embodiment.

FIGS. 7 to 9 show a configuration of electrodes of the first sub-pixel SPX1, the second sub-pixel SPX2, and the third sub-pixel SPX3. FIG. 7 shows the barrier electrode layer BML, the active layer ACT, and the gate electrode layer GE described above with reference to FIG. 6. FIG. 8 shows the source/drain electrode layer SDL and the alignment electrode layer ELT described above with reference to FIG. 6. FIG. 9 is a diagram in which FIGS. 7 and 8 overlap each other so that positions of the barrier electrode layer BML, the active layer ACT, the gate electrode layer GE, the source/drain electrode layer SDL, and the alignment electrode layer ELT correspond, respectively. In FIGS. 7 to 9, the source/drain electrode layer SDL is indicated by a thick solid line, and contact openings (e.g., contact holes) for electrically connecting different electrode patterns are indicated by a square box with an x.

The pixel PX may include a central area 220 and an adjacent area 240.

The central area 220 may be an area in which the pixel circuit PXC is disposed. For example, the first to third transistors T1 to T3 may be disposed in the central area 220. The central area 220 may be referred to as a pixel circuit area.

The adjacent area 240 may be provided to surround (or extend around a periphery of) at least a portion of the central area 220. The adjacent area 240 may include a first adjacent area 242, a second adjacent area 244, and a third adjacent area 246.

The adjacent area 240 may refer to an area in which wirings for providing electrical information to a circuit configuration (e.g., the first to third transistors T1 to T3) disposed in the central area 220 is disposed.

According to an embodiment, widths of the second adjacent area 244 and the third adjacent area 246 in the first direction DR1 may be smaller than the sum of widths of the central area 220 and the first adjacent area 242 in the first direction DR1. Because the widths of the second adjacent area 244 and the third adjacent area 246 are relatively narrow, an aperture ratio of the display device 100 may be improved.

According to an embodiment, at least a portion of each of the sensing line SENL, the first power source VDD, a plurality of data lines DL_a, DL_b, and DL_c, a power source line VL, the main scan line SML, the sub-scan line SSL, and the second power source VSS may be disposed in the adjacent area 240.

According to an embodiment, the first adjacent area 242 may be disposed on one side of the central area 220. The first adjacent area 242 and the central area 220 may overlap each other in the first direction DR1.

According to an embodiment, the second adjacent area 244 and the third adjacent area 246 may be disposed on the other side of the central area 220, respectively. The second adjacent area 244 and the third adjacent area 246 may overlap the central area 220 in the second direction DR2.

FIG. 9 shows an embodiment in which the first adjacent area 242 is disposed on the right side of the central area 220, but the present disclosure is not limited thereto. According to an embodiment, the first adjacent area 242 overlapping the central area 220 in the first direction DR1 may be disposed on the left or both sides of the central area 220.

The first to third transistors T1 to T3 may be disposed in the central area 220.

The first transistor T1 may include a first_a transistor T1_a, a first_b transistor T1_b, and a first_c transistor T1_c. The second transistor T2 may include a second_a transistor T2_a, a second_b transistor T2_b, and a second_c transistor T2_c. The third transistor T3 may include a third_a transistor T3_a, a third_b transistor T3_b, and a third_c transistor T3_c.

The first_a transistor T1_a, the second_a transistor T2_a, the third_a transistor T3_a, and a first capacitor Cst_a may constitute the pixel circuit PXC of the first sub-pixel SPX1 configured to emit light of a first color.

The first_b transistor T1_b, the second_b transistor T2_b, the third_b transistor T3_b, and a second capacitor Cst_b may constitute the pixel circuit PXC of the second sub-pixel SPX2 configured to emit light of a second color.

The first_c transistor T1_c, the second_c transistor T2_c, the third_c transistor T3_c, and a third capacitor Cst_c may constitute the pixel circuit PXC of the third sub-pixel SPX3 configured to emit light of a third color.

According to an embodiment, channels of the first to third transistors T1 to T3 may be formed of the active layer ACT, gate electrodes of the first to third transistors T1 to T3 may be formed of the gate electrode layer GE, and one electrodes and the other electrodes of the first to third transistors T1 to T3 may be formed of the source/drain electrode layer SDL.

According to an embodiment, one electrode and the other electrode of each of the first to third capacitors Cst_a, Cst_b, and Cst_c may be formed of the gate electrode layer GE and the source/drain electrode layer SD, respectively.

The sensing line SENL may be electrically connected to one electrode of the third transistor T3. The sensing line SENL may be disposed in the second adjacent area 244 and the third adjacent area 246. The sensing line SENL may extend in the second direction DR2 and pass through the central area 220.

The first power source VDD may be electrically connected to one electrode of the first transistor T1. The first power source VDD may be disposed in the second adjacent area 244 and the third adjacent area 246. The first power source VDD may extend in the second direction DR2 and pass through the central area 220.

The plurality of data lines DL_a, DL_b, and DL_c may extend in the second direction DR2 and pass through the central area 220.

According to an embodiment, the plurality of data lines DL_a, DL_b, and DL_c may be electrically connected to one electrode of the second transistor T2. For example, an a-th data line DL_a may be electrically connected to the second_a transistor T2_a, a b-th data line DL_b may be electrically connected to the second_b transistor T2_b, and a c-th data line DL_c may be electrically connected to the second_c transistor T2_c.

The power source line VL may be a path through which the second power source VSS of the third sub-pixel SPX3 moves. According to an embodiment, the electrical information provided through the second power source VSS may be applied to the power source line VL via a third_a electrode layer ELT3_a. The power source line VL may extend in the second direction DR2 but may pass through the first adjacent area 242 without passing through the central area 220.

The main scan line SML may extend in the first direction DR1 and may be disposed in the third adjacent area 246 disposed below the central area 220.

According to an embodiment, the main scan line SML may be electrically connected to the gate electrode of the second transistor T2. For example, the main scan line SML may be electrically connected to a gate electrode of each of the second_a transistor T2_a, the second_b transistor T2_b, and the second_c transistor T2_c.

According to an embodiment, the main scan line SML may be electrically connected to the sub-scan line SSL disposed in the first adjacent area 242 through the contact portion CP. According to an embodiment, the scan signal of the sub-scan line SSL may be provided to the main scan line SML through the contact portion CP.

The sub-scan line SSL may extend in the second direction DR2 and may be disposed in the first adjacent area 242 disposed on a side of the central area 220.

According to an embodiment, the sub-scan line SSL may be electrically connected to the main scan line SML through the contact portion CP to apply an electric signal thereto.

According to an embodiment, the sub-scan line SSL may overlap the third_a electrode layer ELT3_a, which is one of alignment electrode layers ELT. A detailed description of this will be provided later with reference to FIG. 13.

The second power source VSS may extend in the first direction DR1 and may be disposed in the third adjacent area 246 disposed below the central area 220. The second power source VSS may be electrically connected to the alignment electrode layer ELT through a contact part CNT and may be configured to supply a power source to the light emitting element LD.

According to an embodiment, the second power source VSS may be electrically connected to the alignment electrode layer ELT through the contact part CNT.

From among the above-described lines, the main scan line SML and the second power source VSS may be referred to as first lines. The first lines may be wrings having at least a portion disposed in the adjacent area 240 and extending in the first direction DR1.

From among the above-described lines, the first power source VDD, the sensing line SENL, the plurality of data lines DL_a, DL_b, and DL_c, the power source line VL, and the sub-scan line SSL may be referred to as second lines. The second lines may be wrings having at least a portion disposed in the adjacent area 240 and extending in the second direction DR2.

A sensing signal line may be further disposed. The sensing signal line may be the i-th sensing signal line SELi described above with reference to FIG. 5. According to an embodiment, the sensing signal line may extend in the first direction DR1 similar to the main scan line SML and may be disposed in the third adjacent area 246.

The alignment electrode layer ELT may be disposed on the source/drain electrode layer SDL to function as a path for applying the electric signal to the sub-pixel SPX. The alignment electrode layer ELT may be disposed on the first lines and the second lines.

According to an embodiment, the alignment electrode layer ELT may have a configuration defining a trench area configured to arrange (or accommodate) the light emitting element LD. The light emitting element LD may be disposed between the plurality of alignment electrode layers ELT when viewed on a plane.

The alignment electrode layer ELT of the first sub-pixel SPX1 may include a first_a electrode layer ELT1_a, a first_b electrode layer ELT1_b, and a first_c electrode layer ELT1_c.

The alignment electrode layer ELT of the second sub-pixel SPX2 may include a second_a electrode layer ELT2_a, a second_b electrode layer ELT2_b, and a second_c electrode layer ELT2_c.

The alignment electrode layer ELT of the third sub-pixel SPX3 may include a third_a electrode layer ELT3_a, a third_b electrode layer ELT3_b, and a third_c electrode layer ELT3_c.

According to an embodiment, the first_a electrode layer ELT1_a, the second_a electrode layer ELT2_a, and the third_a electrode layer ELT3_a may electrically connect the light emitting element LD included in each of the sub-pixels SPX1 to SPX3 and the second power source VSS.

According to an embodiment, the first_b electrode layer ELT1_b, the second_b electrode layer ELT2_b, and the third_b electrode layer ELT3_b may be as an electrical path for applying an anode signal (e.g., an electric signal applied from the first transistor T1 functioning as a driving transistor) to the light emitting element LD included in each of the sub-pixels SPX1 to SPX3.

According to an embodiment, the first_c electrode layer ELT1_c, the second_c electrode layer ELT2_c, and the third_c electrode layer ELT3_c may be an electrical path for applying the second power source VSS or the anode signal (e.g., the electric signal applied from the first transistor T1 functioning as the driving transistor) to the light emitting element LD included in each of the sub-pixels SPX1 to SPX3.

Hereinafter, a structure including the light emitting element LD of the display device 100 according to the embodiment will be described with reference to FIGS. 10 to 12.

Figure 10:
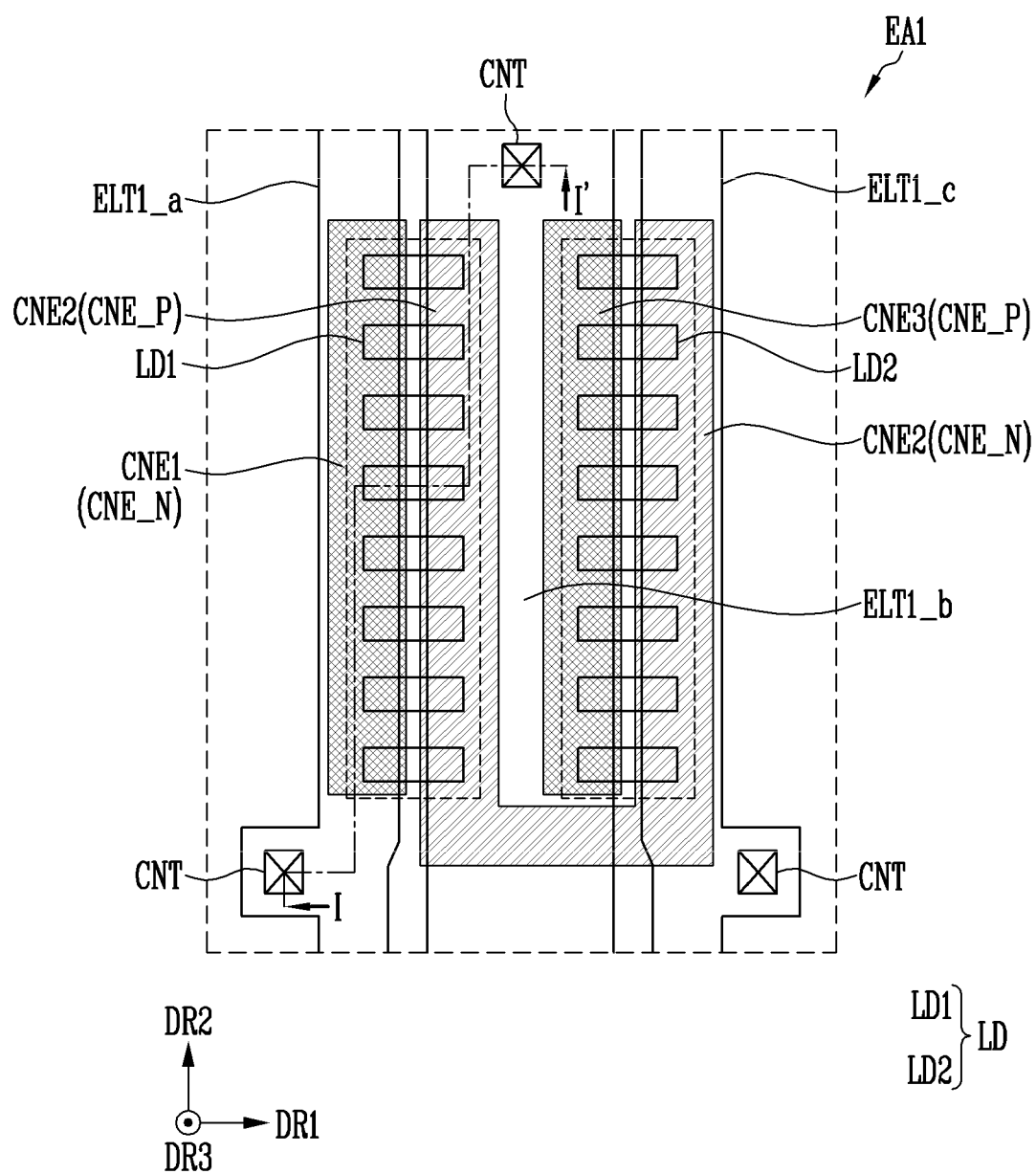
FIG. 10 is an enlarged view of the portion EA1 of FIG. 8.

FIG. 10 is an enlarged view of the portion EA1 of FIG. 8. FIG. 10 is a plan view showing a structure of the first sub-pixel SPX1.

Referring to FIG. 10, the first sub-pixel SPX1 may include the light emitting element LD and the first_a electrode layer ELT1_a, the first_b electrode layer ELT1_b, and the first_c electrode layer ELT1_c, which are included in the alignment electrode layer ELT. The light emitting element LD may include a first light emitting element LD1 and a second light emitting element LD2.

According to an embodiment, the first light emitting element LD1 may be a light emitting element having one end electrically connected to the driving transistor (e.g., the first_a transistor T1_a) and the other end receiving a power source from the second power source VSS.

For example, the second power source VSS may supply the power source to one end of the first light emitting element LD1 through a first contact electrode CNE1 (e.g., a cathode contact electrode CNE_N). The second power source VSS may be electrically connected to the first_a electrode layer ELT1_a through a contact part CNT. In addition, the first_a transistor T1_a may provide the electric signal to the other end of the first light emitting element LD1 through a second contact electrode CNE2 (e.g., an anode contact electrode CNE_P). Accordingly, a direction in which the electric signal (e.g., a current) provided from the second power source VSS flows and a direction in which the electric signal (e.g., a current) provided from the first_a transistor T1_a flows may be the same.

According to an embodiment, the second light emitting element LD2 may be a light emitting element having one end electrically connected to the driving transistor (e.g., the first_a transistor T1_a) and the other end additionally receiving the power source from the second power source VSS.

For example, the second power source VSS may supply the power source to one end of the second light emitting element LD2 through the second contact electrode CNE2. In addition, the first_a transistor T1_a may provide the electric signal to one end of the second light emitting element LD2 through the second contact electrode CNE2. Accordingly, a direction in which the electric signal (e.g., a current) provided from the second power source VSS flows and a direction in which the electric signal (e.g., a current) provided from the first_a transistor T1_a flows may be opposite to each other.

According to an embodiment, a third contact electrode CNE3 (e.g., the cathode contact electrode CNE_N) may be electrically connected to the other end of the second light emitting element LD2.

According to an embodiment, the first_a electrode layer ELT1_a, the first_b electrode layer ELT1_b, and the first_c electrode layer ELT1_c may be sequentially disposed along the first direction DR1 so that a plurality of trench areas extending in the second direction DR2 may be defined. For example, a trench area may be defined between the first_a electrode layer ELT1_a and the first_b electrode layer ELT1_b at where the first light emitting element LD1 may be disposed. Likewise, a trench area may be defined between the first_b electrode layer ELT1_b and the first_c electrode layer ELT1_c at where the second light emitting element LD2 may be disposed.

According to an embodiment, the first_a electrode layer ELT1_a may be an alignment electrode layer to which a cathode signal is provided. The first_b electrode layer ELT1_b may be an alignment electrode layer to which an anode signal is provided. The first_c electrode layer ELT1_c may be an alignment electrode layer to which the anode signal and the cathode signal are provided.

According to an embodiment, the first_a electrode layer ELT1_a may be referred to as a cathode alignment electrode layer. The first_b electrode layer ELT1_b may be referred to as an anode alignment electrode layer. The first_c electrode layer ELT1_c may be referred to as a floating alignment electrode layer or a fluid alignment electrode layer.

A structure of the second sub-pixel SPX2 may correspond to the structure of the first sub-pixel SPX1. According to an embodiment, the second sub-pixel SPX2 may include the first light emitting element LD1, the second light emitting element LD2, the second_a electrode layer ELT2_a, the second_b electrode layer ELT2_b, and the second_c electrode layer ELT2_c. In the second sub-pixel SPX2, the first light emitting element LD1 may be disposed between the second_a electrode layer ELT2_a and the second_b electrode layer ELT2_b, and the second light emitting element LD2 may be disposed between the second_b electrode layer ELT2_b and the second_c electrode layer ELT2_c.

According to an embodiment, the second_a electrode layer ELT2_a may be an alignment electrode layer to which a cathode signal is provided. The second_b electrode layer ELT2_b may be an alignment electrode layer to which an anode signal is provided. The second_c electrode layer ELT2_c may be an alignment electrode layer to which the anode signal and the cathode signal are provided.

According to an embodiment, the second_a electrode layer ELT2_a, the second_b electrode layer ELT2_b, and the second_c electrode layer ELT2_c may be sequentially disposed along the first direction DR1.

The second_a electrode layer ELT2_a may be referred to as a cathode alignment electrode layer. The second_b electrode layer ELT2_b may be referred to as an anode alignment electrode layer. The second_c electrode layer ELT2_c may be referred to as a floating alignment electrode layer or a fluid alignment electrode layer.

The third sub-pixel SPX3 may have a structure partially different from the first sub-pixel SPX1 and the second sub-pixel SPX2. Referring to FIG. 11, the structure of the third sub-pixel SPX3 will be described. FIG. 11 is an enlarged view of a portion EA2 of FIG. 8. FIG. 11 may be a plan view showing the structure of the third sub-pixel SPX3.

Figure 11:
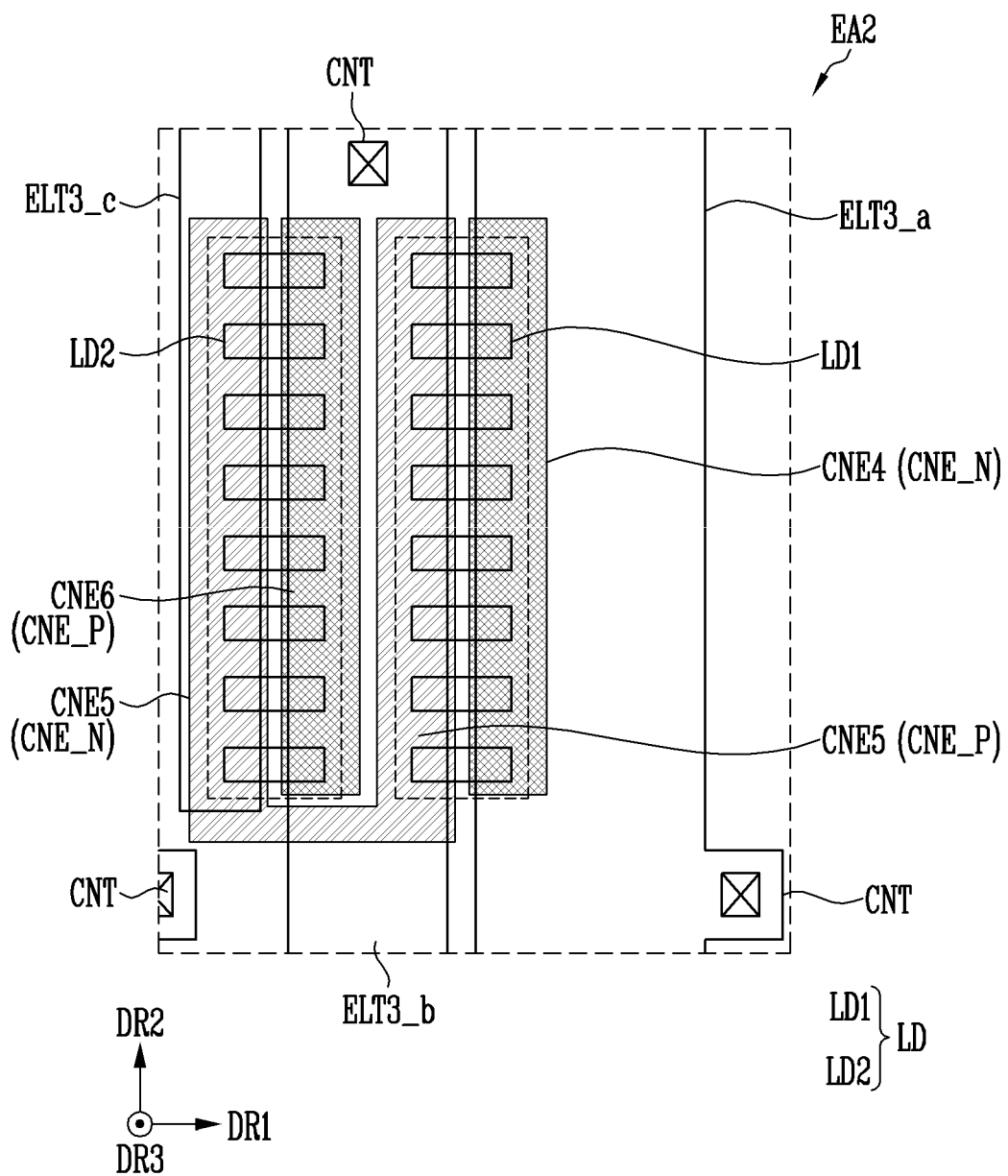
FIG. 11 is an enlarged view of the portion EA2 of FIG. 8.

Referring to FIG. 11, the third sub-pixel SPX3 may include the first light emitting element LD1, the second light emitting element LD2, the third_a electrode layer ELT3_a, the third_b electrode layer ELT3_b, and the third_c electrode layer ELT3_c.

According to an embodiment, the first light emitting element LD1 may be disposed between the third_a electrode layer ELT3_a and the third_b electrode layer ELT3_b. The second light emitting element LD2 may be disposed between the third_b electrode layer ELT3_b and the third_c electrode layer ELT3_c.

According to an embodiment, the second power source VSS may supply power to one end of the first light emitting element LD1 through a fourth contact electrode CNE4 (e.g., a cathode contact electrode CNE_N).

According to an embodiment, the first_c transistor T1_c may provide the electric signal to the other end of the first light emitting element LD1 through a fifth contact electrode CNE5 (e.g., an anode contact electrode CNE_P).

According to an embodiment, the fifth contact electrode CNE5 may provide the electric signal to one end of the second light emitting element LD2.

According to an embodiment, a sixth contact electrode CNE6 (e.g., a cathode contact electrode CNE_N) may be electrically connected to the other end of the second light emitting element LD2.

According to an embodiment, the third_a electrode layer ELT3_a may be an alignment electrode layer to which a cathode signal is provided. The third_b electrode layer ELT3_b may be an alignment electrode layer to which an anode signal is provided. The third_c electrode layer ELT3_c may be an alignment electrode layer to which the anode signal and the cathode signal are provided.

According to an embodiment, the third_c electrode layer ELT3_c, the third_b electrode layer ELT3_b, and the third_a electrode layer ELT3_a may be sequentially disposed along the first direction DR1.

According to an embodiment, a width of the third_a electrode layer ELT3_a may be greater than widths of the third_b electrode layer ELT3_b and the third_c electrode layer ELT3_c. Accordingly, the third_a electrode layer ELT3_a may cover at least the sub-scan line SSL disposed below.

The third_a electrode layer ELT3_a may be referred to as a cathode alignment electrode layer. The third_b electrode layer ELT3_b may be referred to as an anode alignment electrode layer. The third_c electrode layer ELT3_c may be referred to as a floating alignment electrode layer or a fluid alignment electrode layer.

Figure 12:
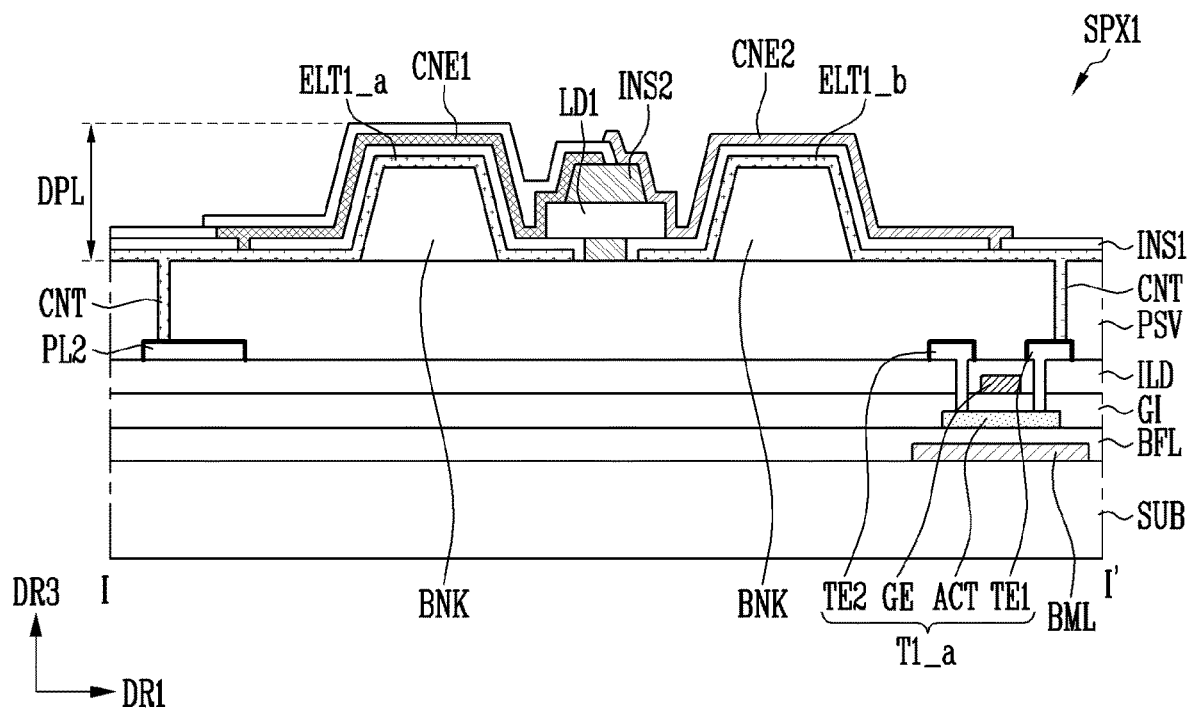
FIG. 12 is a cross-sectional view taken along the line I-I' of FIG. 10.

FIG. 12 is a cross-sectional view taken along the line I-I' of FIG. 10. FIG. 12 is a schematic cross-sectional view for explaining a structure of the layer including the light emitting element LD. FIG. 12 is a cross-sectional view of the structure of the first sub-pixel SPX1. Descriptions that are overlapping with those described above will be simplified or omitted.

Referring to FIG. 12, the first sub-pixel SPX1 may include the first_a transistor T1_a disposed on the substrate SUB. The first_a transistor T1_a may include a first transistor electrode TE1, a second transistor electrode TE2, a gate electrode layer GE, and an active layer ACT. According to an embodiment, the first transistor electrode TE1 may be a source electrode of the first_a transistor T1_a, and the second transistor electrode TE2 may be a drain electrode of the first_a transistor T1_a.

A configuration including the buffer layer BFL, the first_a transistor T1_a, the gate insulating layer GI, the interlayer insulating layer ILD, the second power source line PL2, and the passivation layer PSV included in the first sub-pixel SPX1 may form (or constitute) a pixel circuit unit.

The first sub-pixel SPX1 may include a display element unit DPL disposed on the pixel circuit unit.

The display element unit DPL may include a bank BNK, a first_a electrode layer ELT1_a and a first_b electrode layer ELT1_b included in an alignment electrode layer ELT, a first insulating layer INS1, a first contact electrode CNE1, a first light emitting element LD1, a second contact electrode CNE2, and a second insulating layer INS2. In FIG. 12, the description will be based on the first light emitting element LD1 from among the light emitting elements LD.

The bank BNK may have a shape protruding in an upward direction. The upward direction may be a display direction of the first light emitting element LD1 and may be a third direction DR3 in the drawings. By disposing the first_a electrode layer ELT1_a and the first_b electrode layer ELT1_b on the bank BNK to form a reflective partition wall, light efficiency of the first light emitting element LD1 is improved.

The first_a electrode layer ELT1_a may be electrically connected to a second power source line PL2 through a contact part CNT to receive the power source from the second power source VSS.

The first_b electrode layer ELT1_b may be electrically connected to the first transistor electrode TE1 through a contact part CNT to receive electrical information (e.g., an anode signal).

The first insulating layer INS1 may be disposed on the passivation layer PSV. The first insulating layer INS1 may include at least one of silicon nitride (SiNx), silicon oxide (SiOx), silicon oxynitride (SiOxNy), and aluminum oxide (AlOx). The first insulating layer INS1 may stabilize the electrical connection between electrode configurations and may attenuate influences external influences or interference (e.g., may attenuate influences from outside).

The first light emitting element LD1 may be positioned on the first insulating layer INS1. According to an example, the first insulating layer INS1 may have a groove (e.g., a predetermined groove), at least a portion of the first light emitting element LD1 may contact an end formed by the groove, and another portion of the first light emitting element LD1 may contact another end formed by the groove (e.g., the first light emitting element LD1 may span the groove).

The second insulating layer INS2 may be disposed on the first light emitting element LD1. The second insulating layer INS2 may be formed to cover an area corresponding to the active layer 12 of the first light emitting element LD1. According to an embodiment, the second insulating layer INS2 may include either an organic material or an inorganic material. According to an embodiment, the second insulating layer INS2 may fill a space provided on the rear surface of (e.g., below) the first light emitting element LD1.

The first contact electrode CNE1 and the second contact electrode CNE2 may be disposed on the first insulating layer INS1. The first contact electrode CNE1 and the second contact electrode CNE2 may be electrically connected to the first_a electrode layer ELT1_a and the first_b electrode layer ELT1_b through contact openings (e.g., contact holes) formed in the first insulating layer INS1, respectively.

According to an embodiment, the first contact electrode CNE1 and the second contact electrode CNE2 may include a transparent conductive material. According to an example, the first contact electrode CNE1 may include at least one of conductive materials including indium tin oxide (ITO), indium zinc oxide (IZO), and indium tin zinc oxide (ITZO).

The arrangement relationship related to the first light emitting element LD1, the electrode configurations, and the like is not limited to those described above with reference to FIG. 12, and arrangement relationships according to various different embodiments may be implemented.

Hereinafter, a structure of the electrodes according to an embodiment will be described in detail with reference to FIGS. 13 and 15.

Figure 13:
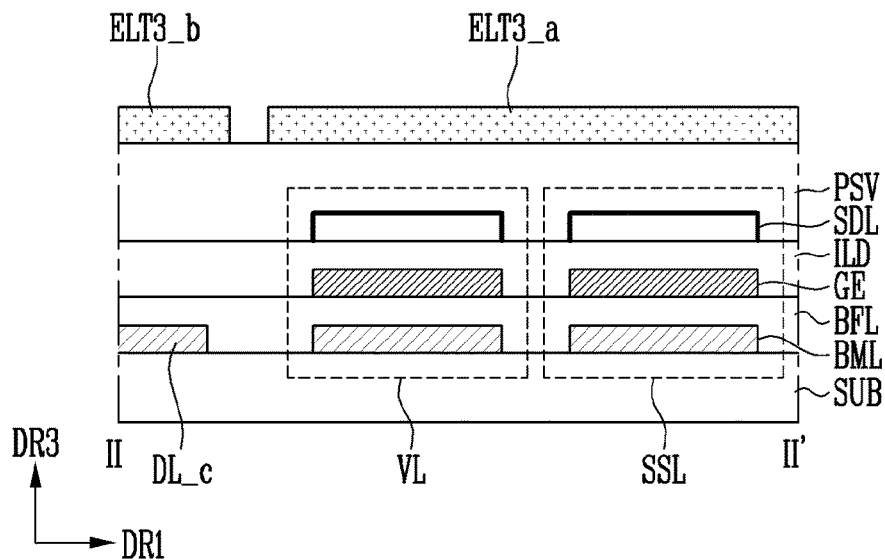
FIG. 13 is a cross-sectional view taken along the line II-II' of FIG. 9.

FIG. 13 is a schematic diagram for describing a shielding structure by the alignment electrode layer ELT of the sub-scan line SSL according to an embodiment.

FIG. 13 is a cross-sectional view taken along the line II-II' of FIG. 9.

Referring to FIG. 13, the power source line VL and the sub-scan line SSL may overlap the third_a electrode layer ELT3_a. According to an embodiment, the power source line VL and the sub-scan line SSL may overlap the cathode alignment electrode layer. The power source line VL and the sub-scan line SSL may not overlap (e.g., may be offset from) the floating alignment electrode layer (e.g., the third_c electrode layer ELT3_c) when viewed on a plane. According to an embodiment, the contact portion CP at where the main scan line SML and the sub-scan line SSL overlap each other may overlap the third_a electrode layer ELT3_a.

According to an embodiment, the power source line VL may be formed of at least a portion of each of the barrier electrode layer BML, the gate electrode layer GE, and the source/drain electrode layer SDL.

According to an embodiment, the sub-scan line SSL may be formed of at least a portion of each of the barrier electrode layer BML, the gate electrode layer GE, and the source/drain electrode layer SDL.

As described above, the sub-scan line SSL may be a path through which the scan signal to be applied to the sub-pixel SPX is provided. According to an embodiment, the sub-scan line SSL may overlap the third_a electrode layer ELT3_a functioning as the cathode alignment electrode layer according to embodiments. Accordingly, the influence of the sub-scan line SSL on the third_a electrode layer ELT3_a can be reduced. For example, according to the embodiment, due to the shielding structure of the third_a electrode layer ELT3_a, which is one of the alignment electrode layers ELT, with respect to the sub-scan line SSL, reliability of the electric signal can be improved.

In addition, according to the embodiment, contact portions CP1 to CP4 and the sub-scan line SSL may be shielded by the third_a electrode layer ELT3_a so that interference between adjacent wirings may be prevented or substantially prevented. For example, the sub-scan line SSL may be shielded by the third_a electrode layer ELT3_a so that influence on any one wiring from among adjacent sub-pixels SPX can be reduced.

In addition, according to the embodiment, the alignment electrode layer ELT overlapping the contact portions CP1 to CP4 and the sub-scan line SSL may not be at least the floating alignment electrode layer. Accordingly, electrical influence on other wirings may be further reduced or prevented by changing the direction of the electric signal provided from the floating alignment electrode layer.

Hereinafter, a comprehensive structure of the electrodes according to an embodiment will be described in detail with reference to FIGS. 14 and 15.

Figure 14:
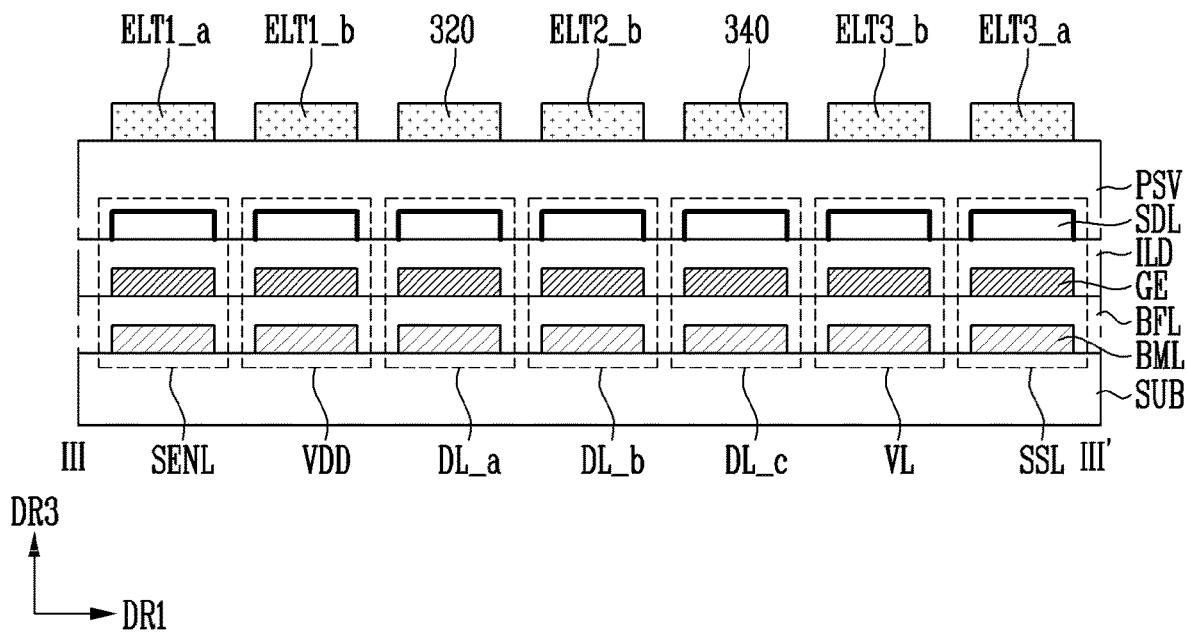
FIG. 14 is a cross-sectional view taken along the line III-III' of FIG. 9.
Figure 15:
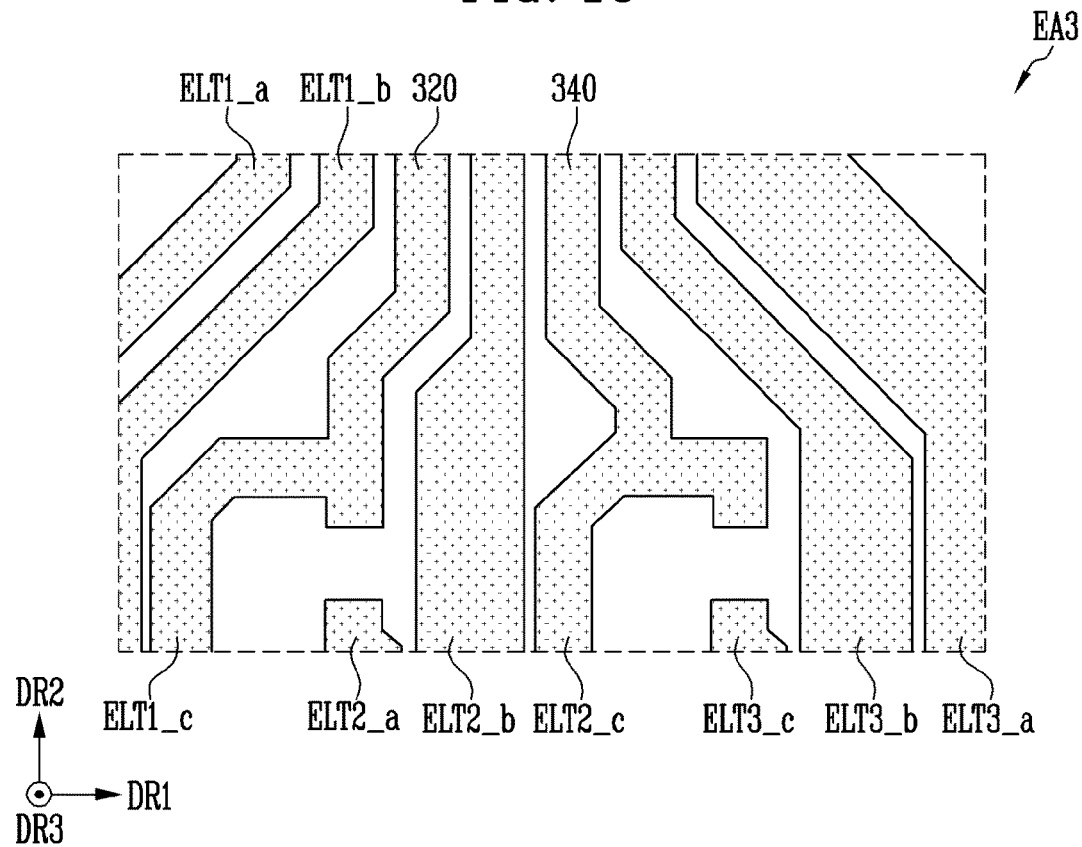
FIG. 15 is an enlarged view of the portion EA3 of FIG. 8.

FIG. 14 is a cross-sectional view taken along the line III-III' of FIG. 9, and FIG. 15 is an enlarged view of the portion EA3 of FIG. 8.

Referring to FIG. 14, the sensing line SENL, the first power source VDD, the a-th data line DL_a, the b-th data line DL_b, the c-th data line DL_c, the power source line VL, and sub-scan line SSL may be formed of at least a portion of the barrier electrode layer BML, the gate electrode layer GE, and the source/drain electrode layer SDL, respectively. However, the structure of the electrodes constituting each line is not limited to the above-described example.

According to an embodiment, the sensing line SENL may overlap any one of the alignment electrode layers ELT when viewed on a plane. For example, the sensing line SENL may overlap the first_a electrode layer ELT1_a.

According to an embodiment, the first power source VDD may overlap any one of the alignment electrode layers ELT when viewed on a plane. For example, the first power source VDD may overlap the first_b electrode layer ELT1_b.

According to an embodiment, the a-th data line DL_a may overlap any one of the alignment electrode layers ELT when viewed on a plane. For example, the a-th data line DL_a may overlap a first root electrode layer 320.

Referring to FIG. 15, the first root electrode layer 320 may be connected to the first_c electrode layer ELT1_c. The first root electrode layer 320 may be spaced apart from the second_a electrode layer ELT2_a. The first root electrode layer 320 may be disposed in the adjacent area 240 without being disposed in the central area 220.

According to an embodiment, after the first root electrode layer 320 is formed to be connected to the second_a electrode layer ELT2_a, the first root electrode layer 320 may be separated from the second_a electrode layer ELT2_a by a separate cutting process during a manufacturing process. According to an embodiment, the first root electrode layer 320 and the second_a electrode layer ELT2_a may be formed in the same process when they are first formed and may then be separated by removing at least a portion between both the electrode layers. Accordingly, the second_a electrode layer ELT2_a may be disposed in the central area 220 without being disposed in the adjacent area 240.

According to an embodiment, the b-th data line DL_b may overlap any one of the alignment electrode layers ELT when viewed on a plane. For example, the b-th data line DL_b may overlap the second_b electrode layer ELT2_b.

According to an embodiment, the c-th data line DL_c may overlap any one of the alignment electrode layers ELT when viewed on a plane. For example, the c-th data line DL_c may overlap a second root electrode layer 340.

Referring to FIG. 15, the second root electrode layer 340 may be connected to the second_c electrode layer ELT2_c. The second root electrode layer 340 may be spaced apart from the third_c electrode layer ELT3_c. The second root electrode layer 340 may be disposed in the adjacent area 240 without being disposed in the central area 220.

According to an embodiment, after the second root electrode layer 340 is formed to be connected to the third_c electrode layer ELT3_c, the second root electrode layer 340 may be separated from the third_c electrode layer ELT3_c by a separate cutting process during a manufacturing process. According to an embodiment, the second root electrode layer 340 and the third_c electrode layer ELT3_c may be formed in the same process when they are first formed and may then be separated by removing at least a portion between both the electrode layers.

According to an embodiment, the power source line VL may overlap any one of the alignment electrode layers ELT when viewed on a plane. For example, the power source line VL may overlap the third_b electrode layer ELT3_b.

According to an embodiment, the sub-sensing line SSL may overlap any one of the alignment electrode layers ELT when viewed on a plane. For example, the sub-sensing line SSL may overlap the third_a electrode layer ELT3_a.

According to an embodiment, at least a portion of the alignment electrode layers ELT may not be disposed in the adjacent area 240. For example, the second_a electrode layer ELT2_a and the third_c electrode layer ELT3_c may not be disposed in the adjacent area 240. At least a portion of the alignment electrode layers ELT not disposed in the adjacent area 240 may be provided in a state connected to at least a portion of the alignment electrode layers ELT disposed in the adjacent area 240 when they are formed by a deposition process and may then be separated from each other by a separate cutting process. Accordingly, the third_c electrode layer ELT3_c may be disposed in the central area 220 without being disposed in the adjacent area 240.

According to an embodiment, the number of alignment electrode layers ELT defined in the adjacent area 240 may be smaller than the number of electrode layers ELT defined in the central area 220. For example, the number of alignment electrode layers ELT disposed in the central area 220 may be a first number, and the number of alignment electrode layers ELT disposed in the adjacent area 240 may be a second number. The first number may be greater than the second number.

According to an embodiment, the number of the second lines defined in the adjacent area 240 may be equal to the number of alignment electrode layers ELT defined in the adjacent area 240, but the second lines may overlap the alignment electrode layers ELT, respectively.

According an embodiment, to increase the aperture ratio of the display device 100, separate wirings or electrode configurations should not be arranged in the opening of the display device 100. According to the arrangement of the wirings and/or electrode configurations in the adjacent area according to embodiments of the present disclosure, density of the electrodes can be improved, and accordingly, the aperture ratio of the display device 100 can be increased.

According to embodiments of the present disclosure, a display device having an improved aperture ratio can be provided by efficiently arranging the wirings.

According to embodiments of the present disclosure, a display device with improved external visibility can be provide by reducing or preventing luminance unevenness from being visually recognized.

Aspects and features of the present disclosure are not limited to the those described above, and other aspects and features that are not mentioned may be clearly understood by those skilled in the art from the present specification and the accompanying drawings.

The above-described embodiments are merely illustrative of the technical spirit of the present disclosure. Those skilled in the art will appreciate that various modifications and changes can be made to the present disclosure without departing from the spirit and scope thereof. Accordingly, the embodiments of the present disclosure described above may be implemented separately or in combination with each other.

Accordingly, the embodiments disclosed in the present specification are not intended to limit the technical spirit of the present disclosure but are provided to explain the technical spirit. The scope of the present disclosure is not limited by these embodiments. The scope of protection of the present disclosure should be interpreted by the appended claims, and all technical spirits within the scope equivalent thereto should be construed as being included in the scope of the present disclosure.

What is claimed is:

1. A display device comprising:
   a pixel, the pixel having a pixel circuit area and an adjacent area extending around at least a portion of the pixel circuit area;
   first lines at least partially in the adjacent area and extending in a first direction;
   second lines at least partially in the adjacent area and extending in a second direction perpendicular to the first direction; and
   alignment electrode layers extending in the second direction and on the first and second lines,
   wherein a first number of the alignment electrode layers are in the pixel circuit area, and a second number of the alignment electrode layers are in the adjacent area, and
   wherein the first number is greater than the second number.

2. The display device of claim 1, wherein at least a portion of the alignment electrode layers are in the pixel circuit area without being in the adjacent area.

3. The display device of claim 2, wherein the alignment electrode layers comprise a root electrode layer in the adjacent area without being in the pixel circuit area, and
   wherein the root electrode layer is spaced apart from at least a portion of the alignment electrode layers in the pixel circuit area.

4. The display device of claim 3, wherein the pixel comprises a first sub-pixel configured to emit light of a first color, a second sub-pixel configured to emit light of a second color, and a third sub-pixel configured to emit light of a third color,
   wherein the alignment electrode layers in the pixel circuit area comprise a first cathode electrode layer, a second cathode electrode layer, a third cathode electrode layer, a first anode electrode layer, a second anode electrode layer, a third anode electrode layer, a first floating electrode layer, a second floating electrode layer, and a third floating electrode layer,
   wherein the first cathode electrode layer, the first anode electrode layer, and the first floating electrode layer are the alignment electrode layer of the first sub-pixel,
   wherein the second cathode electrode layer, the second anode electrode layer, and the second floating electrode layer are the alignment electrode layer of the second sub-pixel, and
   wherein the third cathode electrode layer, the third anode electrode layer, and the third floating electrode layer are the alignment electrode layer of the third sub-pixel.

5. The display device of claim 4, wherein the root electrode layer comprises a first root electrode layer and a second root electrode layer,
   wherein the first cathode electrode layer is spaced apart from the first root electrode layer, and
   wherein the third floating electrode layer is spaced apart from the second root electrode layer.

6. The display device of claim 4, wherein the adjacent area has a first adjacent area, a second adjacent area, and a third adjacent area,
   wherein the first adjacent area overlaps the pixel circuit area in the first direction,
   wherein the second adjacent area and the third adjacent area overlap the pixel circuit area in the second direction, and
   wherein a sum of widths of the pixel circuit area and the first adjacent area in the first direction is smaller than a width of the second adjacent area or the third adjacent area in the first direction.

7. The display device of claim 4, wherein the first cathode electrode layer, the first anode electrode layer, and the first floating electrode layer are sequentially arranged along the first direction, and
   wherein the third floating electrode layer, the third anode electrode layer, and the third cathode electrode layer are sequentially arranged along the first direction.

8. The display device of claim 4, wherein the first lines comprise a main scan line,
   wherein the second lines comprise a sub-scan line electrically connected to the main scan line at a contact portion, and
   wherein the sub-scan line overlaps the third cathode electrode layer.

9. The display device of claim 8, wherein the contact portion overlaps the third cathode electrode layer when viewed on a plane.

10. The display device of claim 8, wherein a width of the third cathode electrode layer in the first direction is greater than a width of each of the third anode electrode layer and the third floating electrode layer in the first direction.

11. The display device of claim 4, wherein the pixel further comprises a first light emitting element and a second light emitting element,
    wherein the first light emitting element is between the third cathode electrode layer and the third anode electrode layer, and wherein the second light emitting element is between the third anode electrode layer and the third floating electrode layer.

12. The display device of claim 11, wherein one end of the first light emitting element is electrically connected to a first contact electrode,
wherein another end of the first light emitting element is electrically connected to a second contact electrode,
wherein one end of the second light emitting element is electrically connected to the second contact electrode, and
wherein the other end of the second light emitting element is electrically connected to a third contact electrode.

13. The display device of claim 1, wherein the second lines comprise data lines configured to provide a data signal,
wherein the data lines comprise a first data line, a second data line, and a third data line, and
wherein each of the first data line, the second data line, and the third data line overlaps any one of the alignment electrode layers when viewed on a plane.

14. The display device of claim 1, wherein the pixel comprises a light emitting element arranged in a trench area defined by at least one of the alignment electrode layers.

15. The display device of claim 1, wherein the second lines are provided in the second number in the adjacent area, and
wherein each of the second lines overlaps the alignment electrode layer.

16. A display device comprising:
a pixel comprising a transistor, the pixel having a pixel circuit area and an adjacent area extending around at least a portion of the pixel circuit area;
first lines in the adjacent area and extending in a first direction;
second lines extending in a second direction perpendicular to the first direction; and
alignment electrode layers extending in the second direction and on the first and second lines,
wherein the first lines comprise a main scan line configured to provide a scan signal to the transistor,
wherein the second lines comprise a sub-scan line electrically connected to the main scan line through a contact portion, and
wherein the sub-scan line overlaps any one of the alignment electrode layers in the adjacent area.

17. The display device of claim 16, wherein the pixel further comprises a first light emitting element and a second light emitting element,
wherein the alignment electrode layers comprise a cathode electrode layer, an anode electrode layer, and a floating electrode layer,
wherein the first light emitting element is between the cathode electrode layer and the anode electrode layer,
wherein the second light emitting element is between the anode electrode layer and the floating electrode layer, and
wherein at least a portion of the cathode electrode layer overlaps the sub-scan line when viewed on a plane.

18. The display device of claim 17, wherein a width of the cathode electrode layer in the first direction is greater than widths of the anode electrode layer and the floating electrode layer in the first direction, and
wherein the floating electrode layer, the anode electrode layer, and the cathode electrode layer are sequentially arranged in the first direction.

* * * * *